US012654590B2

(12) United States Patent
Huang et al.

(10) Patent No.: US 12,654,590 B2
(45) Date of Patent: *Jun. 16, 2026

(54) METHOD FOR CHARGING TRACTION BATTERY AND BATTERY MANAGEMENT SYSTEM

(71) Applicant: CONTEMPORARY AMPEREX TECHNOLOGY (HONG KONG) LIMITED, Hong Kong (CN)

(72) Inventors: Shan Huang, Ningde (CN); Shichao Li, Ningde (CN); Haili Li, Ningde (CN); Wei Zhao, Ningde (CN); Lan Xie, Ningde (CN)

(73) Assignee: CONTEMPORARY AMPEREX TECHNOLOGY (HONG KONG) LIMITED, Hong Kong (CN)

( * ) Notice: Subject to any disclaimer, the term of this patent is extended or adjusted under 35 U.S.C. 154(b) by 0 days.

This patent is subject to a terminal disclaimer.

(21) Appl. No.: 18/458,168

(22) Filed: Aug. 30, 2023

(65) Prior Publication Data

US 2023/0402868 A1 Dec. 14, 2023

Related U.S. Application Data

(63) Continuation of application No. PCT/CN2021/117311, filed on Sep. 8, 2021.

(51) Int. Cl.
B60L 58/13 (2019.01)
B60L 58/16 (2019.01)
(Continued)

(52) U.S. Cl.
CPC .............. B60L 58/13 (2019.02); B60L 58/16 (2019.02); G01R 31/382 (2019.01);
(Continued)

(58) Field of Classification Search
CPC ... G01R 31/382; G01R 31/392; H02J 7/0049; H02J 7/005; H02J 7/0071; H02J 7/00714; H02J 7/007194; B60L 58/13; B60L 58/16
(Continued)

(56) References Cited

U.S. PATENT DOCUMENTS 5,994,877 A * 11/1999 Seri .................... G01R 31/3835
320/132
6,188,202 B1 * 2/2001 Yagi .................. H02J 7/007184
320/125
(Continued)

FOREIGN PATENT DOCUMENTS

CN 102208699 A 10/2011
CN 104269583 A 1/2015
(Continued)

OTHER PUBLICATIONS

EPO-machine-translation of CN-112366375-A (Year: 2021).*
(Continued)

*Primary Examiner* — John T Trischler
(74) *Attorney, Agent, or Firm* — K&L Gates LLP

(57) ABSTRACT

A method for charging a traction battery and a battery management system, which can improve the performance of a traction battery, are disclosed. The method for charging the traction battery is applied to a battery management system BMS of the traction battery, where the method includes: in a charging process of the traction battery, obtaining a state parameter of the traction battery, where the state parameter includes at least one of the following parameters: a state of charge SOC, a state of health SOH, and a temperature; determining an SOC interval value and a discharging parameter corresponding to discharging of the traction battery based on the state parameter of the traction battery, where the discharging parameter includes at least one of the (Continued)

300

In a charging process of a traction battery, obtain an SOC of the traction battery ⟶ 310

If the SOC of the traction battery is less than a preset SOC threshold, determine that an SOC interval value is a first SOC interval value, and a discharging parameter is a first discharging parameter ⟶ 321

If the SOC of the traction battery is greater than or equal to a preset SOC threshold, determine that an SOC interval value is a second SOC interval value, and a discharging parameter is a second discharging parameter ⟶ 322

When the SOC of the traction battery changes by the first SOC interval value, control the traction battery to discharge with the first discharging parameter ⟶ 331

When the SOC of the traction battery changes by the second SOC interval value, control the traction battery to discharge with the second discharging parameter ⟶ 332 following parameters: a discharging time, a discharging current, and a discharging waveform.

20 Claims, 7 Drawing Sheets

(51) Int. Cl.

| | |
|---|---|
| *G01R 31/382* | (2019.01) |
| *G01R 31/392* | (2019.01) |
| *H02J 7/82* | (2026.01) |
| *H02J 7/84* | (2026.01) |
| *H02J 7/90* | (2026.01) |
| *H02J 7/92* | (2026.01) |
| *H02J 7/94* | (2026.01) |
| *B60L 53/62* | (2019.01) |
| *B60L 58/12* | (2019.01) |
| *G01R 31/36* | (2020.01) |
| *G01R 31/367* | (2019.01) |
| *G01R 31/396* | (2019.01) |
| *H01M 10/42* | (2006.01) |

(52) U.S. Cl.
CPC ............ *G01R 31/392* (2019.01); *H02J 7/825* (2026.01); *H02J 7/84* (2026.01); *H02J 7/92* (2026.01); *H02J 7/94* (2026.01); *H02J 7/977* (2026.01); *B60L 53/62* (2019.02); *B60L 58/12* (2019.02); *G01R 31/3648* (2013.01); *G01R 31/367* (2019.01); *G01R 31/396* (2019.01); *H01M 2010/4271* (2013.01); *H01M 2010/4278* (2013.01); *H02J 7/82* (2026.01); *H02J 7/933* (2026.01)

(58) Field of Classification Search
USPC ......................................................... 320/134
See application file for complete search history.

(56) References Cited

U.S. PATENT DOCUMENTS

| | | | | | |
|---|---|---|---|---|---|
| 6,377,030 | B1 * | 4/2002 | Asao | ..................... | H02J 7/0069 |
| | | | | | 320/161 |
| 6,441,588 | B1 * | 8/2002 | Yagi | ........................ | B60L 58/27 |
| | | | | | 320/150 |
| 7,248,022 | B2 * | 7/2007 | Palanisamy | .......... | G01R 31/387 |
| | | | | | 320/149 |
| 7,684,942 | B2 * | 3/2010 | Yun | ....................... | G01R 31/389 |
| | | | | | 702/63 |
| 8,204,702 | B2 * | 6/2012 | Center | .............. | G01R 31/3648 |
| | | | | | 320/132 |
| 8,310,198 | B2 * | 11/2012 | Kurimoto | ............. | B60W 10/26 |
| | | | | | 320/152 |
| 8,368,357 | B2 * | 2/2013 | Ghantous | ............ | H02J 7/00711 |
| | | | | | 320/157 |
| 8,427,112 | B2 * | 4/2013 | Ghantous | ............. | H01M 10/48 |
| | | | | | 320/140 |
| 8,513,921 | B2 * | 8/2013 | Berkowitz | ............ | H02J 7/0048 |
| | | | | | 320/141 |
| 8,638,070 | B2 * | 1/2014 | Maluf | ....................... | H02J 7/00 |
| | | | | | 320/141 |
| 8,700,242 | B2 * | 4/2014 | Kanamori | ........... | B60W 10/113 |
| | | | | | 180/65.265 |
| 8,791,669 | B2 * | 7/2014 | Ghantous | ............. | G01R 31/382 |
| | | | | | 320/155 |
| 8,937,452 | B2 | 1/2015 | Schwarz et al. | | |
| 8,970,178 | B2 * | 3/2015 | Berkowitz | ............ | H01M 10/44 |
| | | | | | 320/141 |
| 8,975,874 | B2 * | 3/2015 | Berkowitz | ................ | H02J 7/00 |
| | | | | | 320/141 |
| 9,026,347 | B2 * | 5/2015 | Gadh | ....................... | B60L 53/67 |
| | | | | | 320/132 |

| | | | | | |
|---|---|---|---|---|---|
| 9,035,621 | B2 * | 5/2015 | Berkowitz | ............ | H01M 10/44 |
| | | | | | 320/155 |
| 9,086,463 | B2 * | 7/2015 | Tamura | ................ | G01R 31/392 |
| 9,121,910 | B2 * | 9/2015 | Maluf | ................... | H01M 10/48 |
| 9,142,994 | B2 * | 9/2015 | Berkowitz | ........... | G01R 31/382 |
| 9,176,195 | B2 * | 11/2015 | Maeda | .................... | B60L 58/15 |
| 9,207,286 | B2 * | 12/2015 | Matsui | ................ | G01R 31/392 |
| 9,239,363 | B2 * | 1/2016 | Matsui | .................... | B60L 58/15 |
| 9,327,591 | B2 * | 5/2016 | Yamamoto | .............. | B60L 58/13 |
| 9,343,920 | B2 * | 5/2016 | Shibata | ................... | B60L 58/13 |
| 9,373,972 | B2 * | 6/2016 | Ghantous | .......... | H02J 7/007184 |
| 9,385,555 | B2 * | 7/2016 | Ghantous | ............. | G01R 31/36 |
| 9,660,305 | B2 * | 5/2017 | Hatta | ...................... | H01M 10/46 |
| 9,793,736 | B2 | 10/2017 | Luo et al. | | |
| 9,963,043 | B2 * | 5/2018 | Kirimoto | ............... | B60L 15/20 |
| 9,981,568 | B2 * | 5/2018 | Minamiura | ............. | B60L 53/35 |
| 10,090,695 | B2 * | 10/2018 | Card | ................... | H02J 7/00711 |
| 10,101,401 | B2 * | 10/2018 | Sejima | .............. | G01R 31/3842 |
| 10,116,147 | B2 * | 10/2018 | Kawamura | ......... | H02J 7/00306 |
| 10,160,444 | B2 * | 12/2018 | Kamatani | ............ | G01R 31/392 |
| 10,164,456 | B2 | 12/2018 | Luo et al. | | |
| 10,170,803 | B2 * | 1/2019 | Kanada | ................... | B60L 58/15 |
| 10,207,596 | B2 * | 2/2019 | Lin | ........................ | B60L 58/21 |
| 10,279,700 | B2 * | 5/2019 | Takebayashi | ........... | B60L 58/13 |
| 10,310,020 | B2 * | 6/2019 | Biletska | ............... | G01R 31/387 |
| 10,322,643 | B2 * | 6/2019 | Poirier | ...................... | B60K 6/28 |
| 10,408,887 | B2 * | 9/2019 | Shimizu | .............. | G01R 31/392 |
| 10,447,054 | B2 * | 10/2019 | Christensen | ........ | H01M 10/425 |
| 10,547,196 | B2 * | 1/2020 | Jung | ................... | H02J 7/00714 |
| 10,693,294 | B2 * | 6/2020 | Kearns | ............. | H02J 13/00002 |
| 10,712,393 | B2 * | 7/2020 | Sejima | .................. | H02J 7/0048 |
| 10,948,548 | B2 * | 3/2021 | Gao | ...................... | G01R 31/388 |
| 10,991,991 | B2 * | 4/2021 | He | ...................... | H02J 7/00036 |
| 10,998,752 | B2 * | 5/2021 | Jung | ................. | H02J 7/007182 |
| 11,108,247 | B2 * | 8/2021 | Li | .......................... | H02J 7/0048 |
| 11,152,656 | B1 * | 10/2021 | Huang | ................ | H01M 10/613 |
| 11,196,096 | B2 * | 12/2021 | Song | ................... | H01M 50/204 |
| 11,225,170 | B2 * | 1/2022 | Wang | .................... | H02J 7/0048 |
| 11,404,896 | B2 * | 8/2022 | Du | .................... | H02J 7/007188 |
| 11,437,838 | B2 * | 9/2022 | Du | ......................... | H02J 7/0048 |
| 11,486,934 | B2 * | 11/2022 | Tang | ................. | G01R 31/3648 |
| 11,502,531 | B2 * | 11/2022 | Sun | ...................... | H02J 7/0048 |
| 11,525,862 | B2 * | 12/2022 | Xie | ..................... | G01R 31/382 |
| 11,563,330 | B2 * | 1/2023 | Tenma | ................... | B60L 53/22 |
| 11,569,678 | B2 * | 1/2023 | Kang | ............. | H02J 7/007194 |
| 11,590,857 | B2 * | 2/2023 | Ruan | ................... | H02J 7/0048 |
| 11,598,811 | B2 * | 3/2023 | Ruan | ................... | G01R 31/388 |
| 11,609,276 | B2 * | 3/2023 | Ruan | ................... | H02J 7/0048 |
| 11,735,945 | B2 * | 8/2023 | Li | ....................... | H02J 7/00302 |
| | | | | | 320/107 |
| 11,762,027 | B2 * | 9/2023 | Xu | ........................ | H02J 7/0013 |
| | | | | | 320/134 |
| 11,774,507 | B2 * | 10/2023 | Tang | .................. | G01R 31/3835 |
| | | | | | 324/426 |
| 11,796,596 | B2 * | 10/2023 | Choi | ..................... | H01M 10/48 |
| 11,870,289 | B2 * | 1/2024 | Huang | ................ | H02J 7/00712 |
| 11,872,903 | B2 * | 1/2024 | Zhang | .................. | H02J 7/0071 |
| 11,906,590 | B2 * | 2/2024 | Liu | .................. | G01R 31/3835 |
| 11,909,244 | B2 * | 2/2024 | Li | ........................ | H01M 10/44 |
| 11,933,851 | B2 * | 3/2024 | Hyun | ................ | G01R 31/3648 |
| 11,955,608 | B2 * | 4/2024 | Xie | ..................... | H01M 10/482 |
| 11,990,656 | B2 * | 5/2024 | Bryant | ................ | H01M 16/006 |
| 12,050,252 | B2 * | 7/2024 | Chen | ................. | H01M 10/425 |
| 12,051,934 | B2 * | 7/2024 | Yan | .................... | H01M 10/425 |
| 12,181,533 | B2 * | 12/2024 | Ruan | ................... | H02J 7/0048 |
| 12,199,456 | B2 * | 1/2025 | Li | ........................ | H01M 10/44 |
| 12,294,127 | B2 * | 5/2025 | Bryant | ............. | H01M 8/04395 |
| 2002/0070710 | A1 * | 6/2002 | Yagi | ........................ | B60L 58/27 |
| | | | | | 320/150 |
| 2002/0195999 | A1 * | 12/2002 | Kimura | ................. | B60L 3/0046 |
| | | | | | 320/134 |
| 2005/0110466 | A1 * | 5/2005 | Shoji | .................... | G01R 31/396 |
| | | | | | 320/150 |
| 2005/0269993 | A1 * | 12/2005 | Palanisamy | .......... | G01R 31/387 |
| | | | | | 320/149 |
| 2008/0103709 | A1 * | 5/2008 | Yun | ....................... | H01M 10/48 |
| | | | | | 702/63 |

(56) References Cited

U.S. PATENT DOCUMENTS

| | | | |
|---|---|---|---|
| 2009/0112495 A1* | 4/2009 | Center | G01R 31/392 |
| | | | 903/903 |
| 2010/0259219 A1* | 10/2010 | Kurimoto | H01M 10/44 |
| | | | 320/109 |
| 2011/0285356 A1* | 11/2011 | Maluf | H02J 7/00 |
| | | | 320/139 |
| 2011/0316548 A1* | 12/2011 | Ghantous | H01M 50/569 |
| | | | 324/427 |
| 2012/0007556 A1* | 1/2012 | Matsui | B60L 58/18 |
| | | | 320/112 |
| 2012/0032648 A1* | 2/2012 | Ghantous | H02J 7/00 |
| | | | 320/139 |
| 2012/0200266 A1* | 8/2012 | Berkowitz | H01M 10/44 |
| | | | 320/139 |
| 2012/0203483 A1* | 8/2012 | Ghantous | G01R 31/388 |
| | | | 702/63 |
| 2012/0245781 A1* | 9/2012 | Kanamori | B60L 58/24 |
| | | | 180/65.265 |
| 2012/0248876 A1* | 10/2012 | Tamura | G01R 31/392 |
| | | | 307/66 |
| 2013/0062941 A1* | 3/2013 | Yamamoto | B60L 3/0092 |
| | | | 307/10.6 |
| 2013/0113433 A1* | 5/2013 | Shibata | G01R 31/392 |
| | | | 320/134 |
| 2013/0154548 A1* | 6/2013 | Berkowitz | G01R 31/3835 |
| | | | 320/128 |
| 2013/0179061 A1* | 7/2013 | Gadh | B60L 53/305 |
| | | | 701/1 |
| 2013/0271148 A1* | 10/2013 | Maeda | G01R 31/392 |
| | | | 324/426 |
| 2013/0278221 A1* | 10/2013 | Maeda | G01R 31/392 |
| | | | 320/134 |
| 2014/0021959 A1* | 1/2014 | Maluf | H02J 7/0048 |
| | | | 324/426 |
| 2014/0084846 A1* | 3/2014 | Berkowitz | H02J 7/0071 |
| | | | 320/141 |
| 2014/0088781 A1* | 3/2014 | Kearns | H02J 3/322 |
| | | | 700/295 |
| 2014/0103934 A1* | 4/2014 | Matsui | B60L 3/0046 |
| | | | 324/427 |
| 2014/0139192 A1* | 5/2014 | Berkowitz | H02J 7/007184 |
| | | | 320/141 |
| 2014/0162091 A1* | 6/2014 | Hatta | H02J 3/32 |
| | | | 429/50 |
| 2014/0295261 A1* | 10/2014 | Miyake | H01M 10/0568 |
| | | | 429/188 |
| 2014/0312912 A1* | 10/2014 | Berkowitz | G01R 31/388 |
| | | | 324/426 |
| 2015/0153417 A1* | 6/2015 | Maluf | G01R 31/382 |
| | | | 324/426 |
| 2015/0155734 A1* | 6/2015 | Ghantous | H02J 7/00 |
| | | | 320/162 |
| 2015/0219722 A1* | 8/2015 | Maluf | H02J 7/00711 |
| | | | 324/426 |
| 2015/0377976 A1* | 12/2015 | Maluf | G01R 31/392 |
| | | | 702/63 |
| 2015/0380957 A1* | 12/2015 | Ghantous | G01R 31/36 |
| | | | 320/134 |
| 2016/0064957 A1* | 3/2016 | Card | H02J 7/00711 |
| | | | 320/129 |
| 2016/0111898 A1 | 4/2016 | Luo et al. | |
| 2016/0202324 A1* | 7/2016 | Biletska | B60L 58/12 |
| | | | 702/63 |
| 2016/0259012 A1* | 9/2016 | Sejima | G01R 31/367 |
| 2016/0294021 A1* | 10/2016 | Ueno | H01M 10/443 |
| 2016/0297318 A1* | 10/2016 | Kirimoto | B60L 15/20 |
| 2016/0344208 A1* | 11/2016 | Kawamura | B60L 3/0046 |
| 2016/0372800 A1* | 12/2016 | Kanada | B60L 58/16 |
| 2017/0104359 A1* | 4/2017 | Jung | H02J 7/0071 |
| 2017/0113565 A1* | 4/2017 | Lin | B60L 58/12 |
| 2017/0176544 A1* | 6/2017 | Shimizu | G01R 31/392 |
| 2017/0244255 A1 | 8/2017 | Luo et al. | |

| | | | |
|---|---|---|---|
| 2017/0269167 A1* | 9/2017 | Willey | H02J 7/0047 |
| 2017/0305292 A1* | 10/2017 | Minamiura | B60L 58/20 |
| 2017/0338666 A1* | 11/2017 | Christensen | G01R 31/392 |
| 2018/0111601 A1* | 4/2018 | Kamatani | B60W 10/26 |
| 2018/0134173 A1* | 5/2018 | Takebayashi | G01R 31/36 |
| 2018/0149703 A1* | 5/2018 | Tohara | H02J 7/0068 |
| 2018/0264956 A1* | 9/2018 | Takagi | H02J 7/0068 |
| 2018/0326861 A1* | 11/2018 | Poirier | B60L 58/15 |
| 2019/0025377 A1* | 1/2019 | Sejima | H01M 10/482 |
| 2019/0184846 A1* | 6/2019 | Kang | B60L 58/12 |
| 2020/0028217 A1* | 1/2020 | He | H01M 10/482 |
| 2020/0049774 A1* | 2/2020 | Gao | G01R 31/392 |
| 2020/0079230 A1* | 3/2020 | Tenma | B60L 53/22 |
| 2020/0112178 A1* | 4/2020 | Jung | H02J 7/007182 |
| 2020/0195029 A1* | 6/2020 | Fujita | H02J 7/0071 |
| 2020/0319253 A1* | 10/2020 | Xie | G01R 31/3648 |
| 2020/0335835 A1* | 10/2020 | Song | H01M 10/486 |
| 2020/0339002 A1* | 10/2020 | Böttger | B60L 58/16 |
| 2020/0341067 A1* | 10/2020 | Ruan | H01M 10/48 |
| 2020/0341073 A1* | 10/2020 | Tang | G01R 31/3842 |
| 2021/0048479 A1* | 2/2021 | Hyun | G01R 31/3646 |
| 2021/0066947 A1* | 3/2021 | Du | H02J 7/007182 |
| 2021/0083484 A1* | 3/2021 | Li | H02J 7/0048 |
| 2021/0132152 A1 | 5/2021 | Choi | |
| 2021/0146794 A1* | 5/2021 | Ruan | H02J 7/00032 |
| 2021/0148988 A1* | 5/2021 | Gao | G01R 31/388 |
| 2021/0155116 A1* | 5/2021 | Wang | B60L 58/22 |
| 2021/0263104 A1* | 8/2021 | Zhu | H01M 10/486 |
| 2021/0305638 A1* | 9/2021 | Huang | H01M 10/48 |
| 2022/0123578 A1* | 4/2022 | Du | H02J 7/007188 |
| 2022/0140636 A1* | 5/2022 | Yasugi | H02J 7/005 |
| | | | 320/134 |
| 2022/0200313 A1* | 6/2022 | Ogasawara | B60L 58/16 |
| 2022/0236333 A1* | 7/2022 | Liu | H01M 10/425 |
| 2022/0250497 A1* | 8/2022 | Zhang | B60L 58/13 |
| 2022/0255336 A1* | 8/2022 | Li | H02J 7/00712 |
| 2022/0268845 A1* | 8/2022 | Xu | H02J 7/0013 |
| 2022/0276310 A1* | 9/2022 | Ruan | G01R 31/396 |
| 2022/0283236 A1* | 9/2022 | Tang | H02J 7/005 |
| 2022/0311262 A1* | 9/2022 | Schmidt | H02J 7/0047 |
| 2022/0320888 A1* | 10/2022 | Chen | G01R 31/3835 |
| 2022/0326308 A1* | 10/2022 | Chen | G01R 31/3842 |
| 2022/0329094 A1* | 10/2022 | Sun | H02J 7/0047 |
| 2022/0352730 A1* | 11/2022 | Li | H02J 7/007 |
| 2022/0407094 A1* | 12/2022 | Bryant | H01M 8/04358 |
| 2023/0018810 A1* | 1/2023 | Li | G01R 31/3835 |
| 2023/0031352 A1* | 2/2023 | Yan | B60L 53/53 |
| 2023/0034272 A1* | 2/2023 | Liu | H02J 7/007182 |
| 2023/0035145 A1* | 2/2023 | Yan | H02J 7/00036 |
| 2023/0204674 A1* | 6/2023 | Ruan | H02J 7/0048 |
| | | | 324/427 |
| 2023/0238816 A1* | 7/2023 | Xiao | H01M 50/209 |
| | | | 320/132 |
| 2023/0261487 A1* | 8/2023 | Cai | B60L 58/12 |
| | | | 320/128 |
| 2023/0261504 A1* | 8/2023 | Zhang | B60L 53/22 |
| | | | 320/103 |
| 2023/0271523 A1* | 8/2023 | Huang | H02J 7/00309 |
| | | | 320/109 |
| 2023/0294541 A1* | 9/2023 | Huang | H02J 7/007182 |
| | | | 320/134 |
| 2023/0307934 A1* | 9/2023 | Huang | B60L 53/62 |
| 2023/0307937 A1* | 9/2023 | Huang | H01M 10/44 |
| 2023/0327464 A1* | 10/2023 | Huang | H02J 7/00309 |
| | | | 320/150 |
| 2023/0335822 A1* | 10/2023 | Huang | H01M 10/425 |
| 2023/0356623 A1* | 11/2023 | Araujo Xavier | H01M 10/441 |
| 2023/0391221 A1* | 12/2023 | Matsuda | H02J 7/0071 |
| 2023/0396089 A1* | 12/2023 | Xie | H02J 7/00714 |
| 2023/0398902 A1* | 12/2023 | Huang | H01M 10/44 |
| 2024/0022092 A1* | 1/2024 | Huang | H02J 7/0047 |
| 2024/0039063 A1* | 2/2024 | Xie | H01M 10/482 |
| 2024/0149729 A1* | 5/2024 | Ropel | B60L 50/64 |
| 2024/0149730 A1* | 5/2024 | Ropel | B60L 53/62 |
| 2024/0149731 A1* | 5/2024 | Ropel | B60L 53/11 |
| 2024/0162508 A1* | 5/2024 | Li | H01M 10/446 |
| 2024/0178695 A1* | 5/2024 | Sun | H02J 7/007194 |

(56)          References Cited

U.S. PATENT DOCUMENTS

| | | | | |
|---|---|---|---|---|
| 2024/0250546 A1* | 7/2024 | Wang | ....................... | B60L 58/24 |
| 2024/0258544 A1* | 8/2024 | Bryant | ................ | H01M 16/006 |
| 2024/0272230 A1* | 8/2024 | Xie | ....................... | H01M 10/42 |

FOREIGN PATENT DOCUMENTS

| | | | |
|---|---|---|---|
| CN | 104297690 | A | 1/2015 |
| CN | 105576306 | A | 5/2016 |
| CN | 107104249 | A | 8/2017 |
| CN | 110611133 | A | 12/2019 |
| CN | 110828924 | A | 2/2020 |
| CN | 112083335 | A | 12/2020 |
| CN | 112366375 | A | 2/2021 |
| CN | 112886675 | A | 6/2021 |
| DE | 102019123739 | A1 | 3/2021 |
| JP | 2000106219 | A | 4/2000 |
| JP | 6351347 | B2 * | 7/2018 |
| JP | 2019097353 | A | 6/2019 |
| JP | 2020191300 | A | 11/2020 |
| JP | 2022548505 | A | 11/2022 |
| KR | 20140040054 | A | 4/2014 |

OTHER PUBLICATIONS

The international search report received in the corresponding international application PCT/CN2021/117311, mailed Feb. 9, 2022.

The written opinion received in the corresponding international application PCT/CN2021/117311, mailed Feb. 9, 2022.

Notice of Reasons for Refusal received in the corresponding Japanese application 2023-536183, mailed on Jun. 17, 2024.

The extended European search report received in the corresponding European application 21956349.1, mailed Jan. 22, 2024.

Notification to Grant Patent Right for Invention received in the corresponding Chinese application 202180006724.5, mailed Nov. 15, 2023.

Office Action (with English Machine Translation), mailed Aug. 11, 2025, for corresponding Korean Patent Application Serial No. 10-2023-7019716.

The Office Action mailed Mar. 10, 2026 for corresponding European Patent Application No. 21956349.1.

* cited by examiner

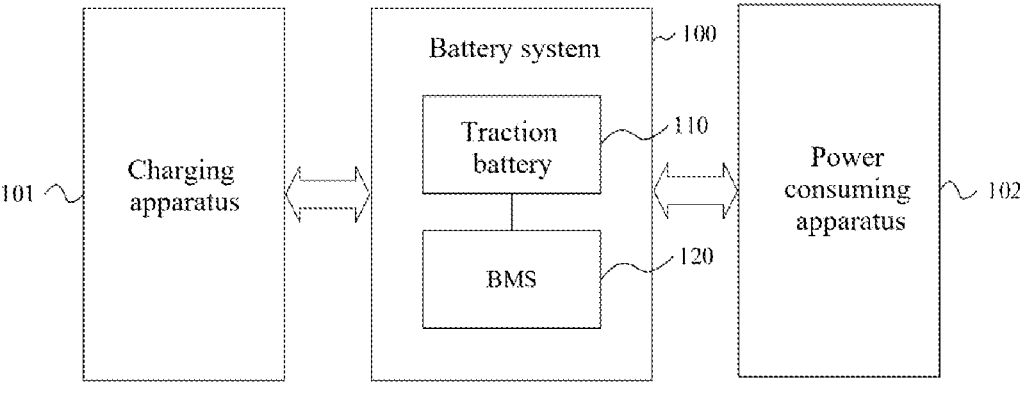

Battery system ⌐ 100

Charging apparatus

101

Traction battery ⌐ 110

BMS ⌐ 120

Power consuming apparatus

In a charging process of a traction battery, obtain a state parameter of the traction battery — 210

Determine an SOC interval value and a discharging parameter corresponding to discharging of the traction battery based on the state parameter of the traction battery — 220

When an SOC of the traction battery changes by the SOC interval value, control the traction battery to discharge with the discharging parameter — 230

FIG. 2

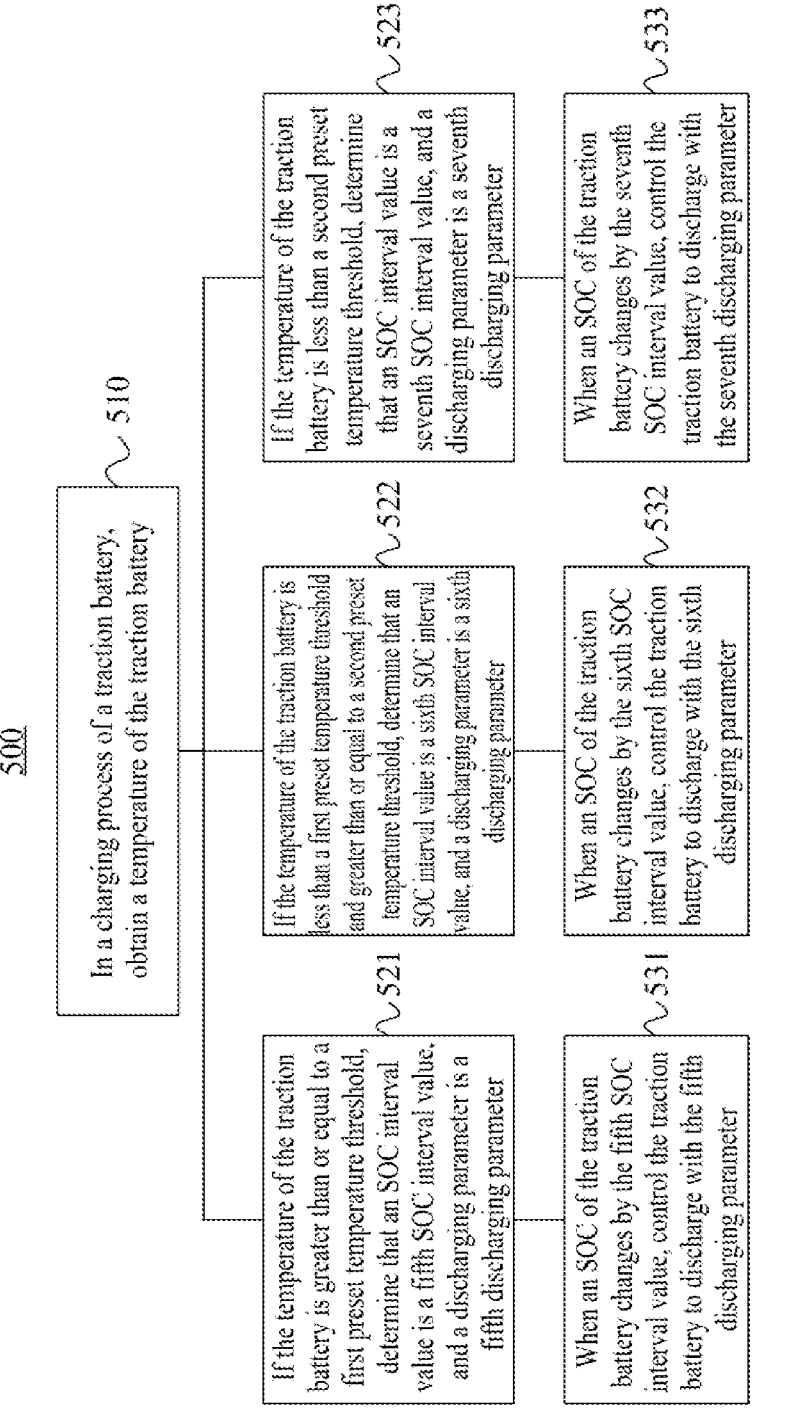

500

In a charging process of a traction battery, obtain a temperature of the traction battery ~510

If the temperature of the traction battery is greater than or equal to a first preset temperature threshold, determine that an SOC interval value is a fifth SOC interval value, and a discharging parameter is a fifth discharging parameter ~521

If the temperature of the traction battery is less than a first preset temperature threshold and greater than or equal to a second preset temperature threshold, determine that an SOC interval value is a sixth SOC interval value, and a discharging parameter is a sixth discharging parameter ~522

If the temperature of the traction battery is less than a second preset temperature threshold, determine that an SOC interval value is a seventh SOC interval value, and a discharging parameter is a seventh discharging parameter ~523

When an SOC of the traction battery changes by the fifth SOC interval value, control the traction battery to discharge with the fifth discharging parameter ~531

When an SOC of the traction battery changes by the sixth SOC interval value, control the traction battery to discharge with the sixth discharging parameter ~532

When an SOC of the traction battery changes by the seventh SOC interval value, control the traction battery to discharge with the seventh discharging parameter ~533

FIG. 5

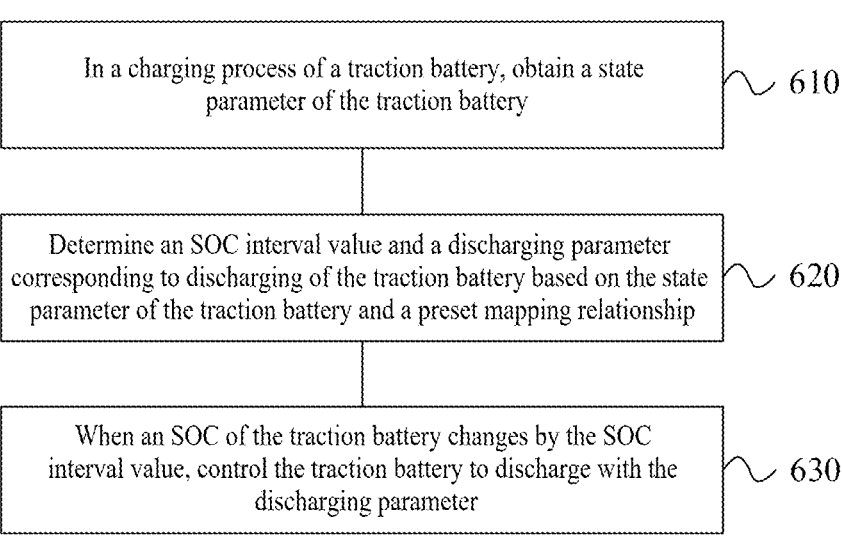

600

In a charging process of a traction battery, obtain a state parameter of the traction battery — 610

Determine an SOC interval value and a discharging parameter corresponding to discharging of the traction battery based on the state parameter of the traction battery and a preset mapping relationship — 620

When an SOC of the traction battery changes by the SOC interval value, control the traction battery to discharge with the discharging parameter — 630

*FIG. 6*

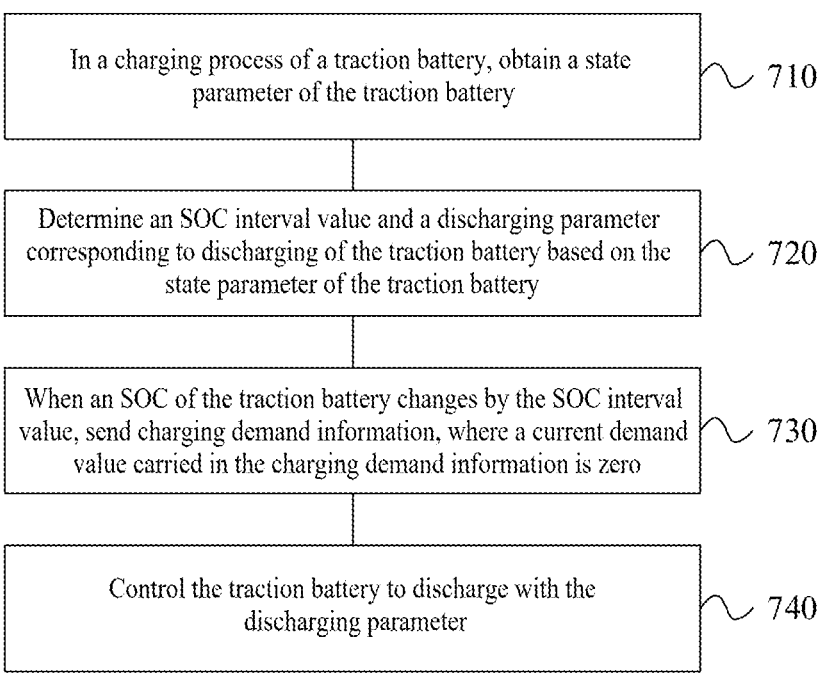

700

In a charging process of a traction battery, obtain a state parameter of the traction battery — 710

Determine an SOC interval value and a discharging parameter corresponding to discharging of the traction battery based on the state parameter of the traction battery — 720

When an SOC of the traction battery changes by the SOC interval value, send charging demand information, where a current demand value carried in the charging demand information is zero — 730

Control the traction battery to discharge with the discharging parameter — 740

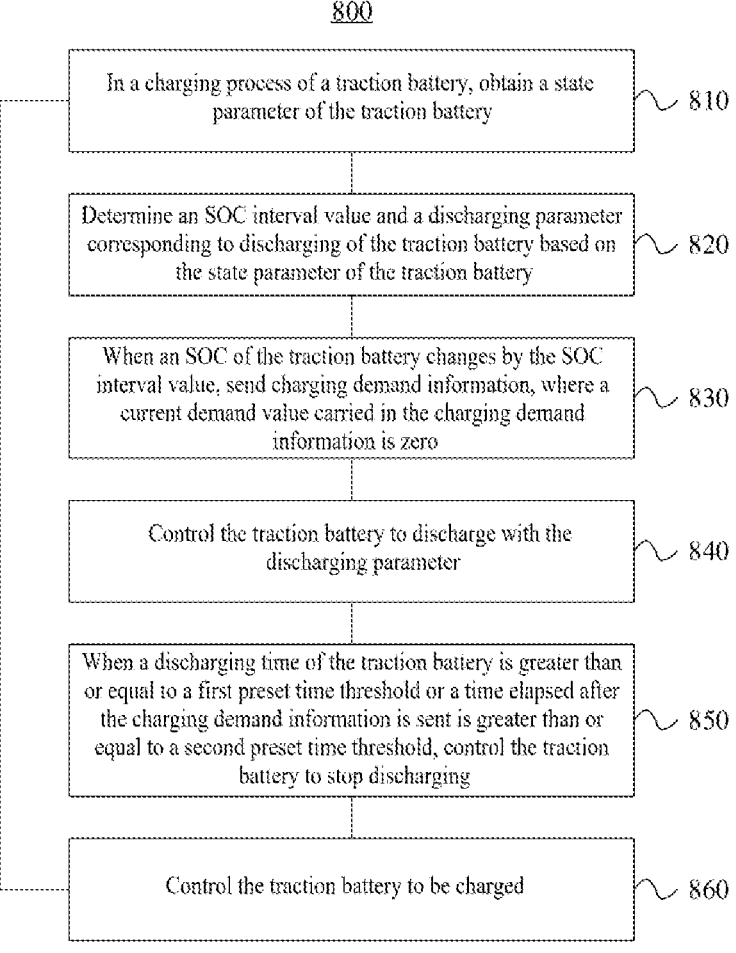

In a charging process of a traction battery, obtain a state parameter of the traction battery ~ 810

Determine an SOC interval value and a discharging parameter corresponding to discharging of the traction battery based on the state parameter of the traction battery ~ 820

When an SOC of the traction battery changes by the SOC interval value, send charging demand information, where a current demand value carried in the charging demand information is zero ~ 830

Control the traction battery to discharge with the discharging parameter ~ 840

When a discharging time of the traction battery is greater than or equal to a first preset time threshold or a time elapsed after the charging demand information is sent is greater than or equal to a second preset time threshold, control the traction battery to stop discharging ~ 850

Control the traction battery to be charged ~ 860

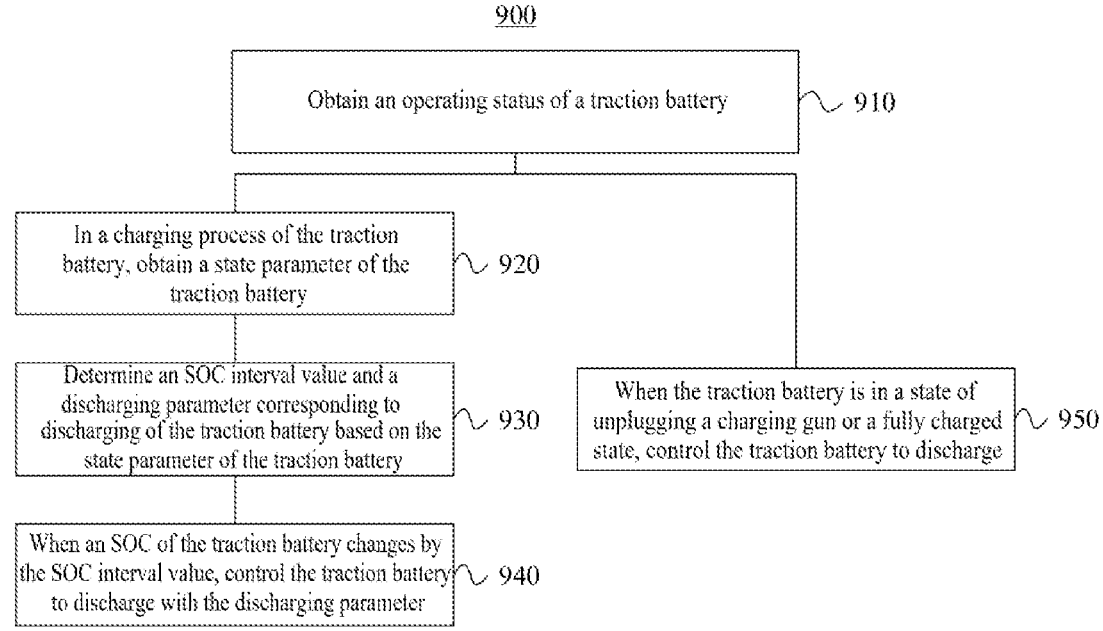

Obtain an operating status of a traction battery    ⌐⌐ 910

In a charging process of the traction battery, obtain a state parameter of the traction battery    ⌐⌐ 920

Determine an SOC interval value and a discharging parameter corresponding to discharging of the traction battery based on the state parameter of the traction battery    ⌐⌐ 930

When an SOC of the traction battery changes by the SOC interval value, control the traction battery to discharge with the discharging parameter    ⌐⌐ 940

When the traction battery is in a state of unplugging a charging gun or a fully charged state, control the traction battery to discharge    ⌐⌐ 950

*FIG. 9*

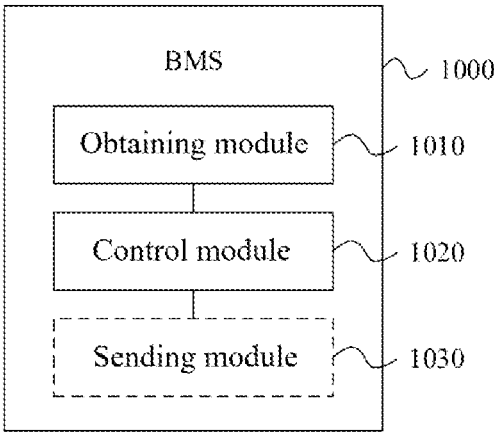

BMS    ⌐⌐ 1000

Obtaining module    ⌐⌐ 1010

Control module    ⌐⌐ 1020

Sending module    ⌐⌐ 1030

*FIG. 10*

METHOD FOR CHARGING TRACTION BATTERY AND BATTERY MANAGEMENT SYSTEM

CROSS-REFERENCE TO RELATED APPLICATIONS

The present application is a continuation of International Application No. PCT/CN2021/117311, filed on Sep. 8, 2021, the entire content of which is incorporated herein by reference.

TECHNICAL FIELD

The present application relates to the field of traction batteries, and in particular, to a method for charging a traction battery and a battery management system.

BACKGROUND ART

With the development of the times, electric vehicles have huge market prospects due to the high environmental protection, low noise, and low use costs of the electric vehicles, and can effectively promote energy conservation and emission reduction, which is beneficial to the development and progress of the society.

For electric vehicles, a traction battery technology is an important factor related to the development of the electric vehicles, which will affect people's acceptance of the electric vehicles. Therefore, how to improve the performance of a traction battery is a technical problem to be solved.

SUMMARY OF THE INVENTION

Embodiments of the present application provide a method for charging a traction battery and a battery management system, which can improve the performance of a traction battery.

According to a first aspect, a method for charging a traction battery is provided, which is applied to a battery management system BMS of the traction battery, and the method includes: in a charging process of the traction battery, obtaining a state parameter of the traction battery, where the state parameter includes at least one of the following parameters: a state of charge SOC, a state of health SOH, and a temperature; determining an SOC interval value and a discharging parameter corresponding to discharging of the traction battery based on the state parameter of the traction battery, where the discharging parameter includes at least one of the following parameters: a discharging time, a discharging current, and a discharging waveform; and when the SOC of the traction battery changes by the SOC interval value, controlling the traction battery to discharge with the discharging parameter.

Through the technical solution of this embodiment of the present application, in the charging process of the traction battery, the traction battery can be controlled to discharge to prevent the risk of lithium precipitation in the traction battery and improve the safety performance of the traction battery. Further, a discharging interval and the discharging parameter in the charging process of the traction battery may be determined based on the state parameter of the traction battery, and the discharging interval is the SOC interval, where the state parameter may include: at least one of the state of charge SOC, the state of health SOH, and the temperature, these state parameters are all important parameters affecting the performance of the traction battery, and may affect the occurrence of lithium precipitation in the traction battery. Based on the state parameter of the traction battery, the traction battery is controlled to discharge with the SOC interval value and the discharging parameter in the charging process, so that a discharge design of the traction battery in the charging process is more proper, and on the basis of ensuring the safety performance of the traction battery, the charging performance of the traction battery is also improved.

In some possible implementations, the state parameter includes the SOC, and the discharging parameter includes the discharging time and/or the discharging current; and the determining an SOC interval value and a discharging parameter corresponding to discharging of the traction battery based on the state parameter of the traction battery includes: if the SOC of the traction battery is less than a preset SOC threshold, determining that the SOC interval value is a first SOC interval value, and the discharging parameter is a first discharging parameter; and if the SOC of the traction battery is greater than or equal to the preset SOC threshold, determining that the SOC interval value is a second SOC interval value, and the discharging parameter is a second discharging parameter, where the first SOC interval value is greater than the second SOC interval value, and/or the first discharging parameter is less than the second discharging parameter.

In the technical solution of this implementation, one preset SOC threshold is set to divide the SOC of the traction battery into two ranges. If the SOC of the traction battery is greater than or equal to the preset SOC threshold, a state of charge of the traction battery is relatively high and a discharge capacity is relatively strong. Then, it is determined that the SOC interval value corresponding to the discharging of the traction battery is the smaller first SOC interval value, and/or it is determined that the discharging parameter corresponding to the discharging of the traction battery is the larger first discharging parameter. Otherwise, if the SOC of the traction battery is less than the preset SOC threshold, the state of charge of the traction battery is relatively low and the discharge capacity is relatively weak. Then, it is determined that the SOC interval value corresponding to the discharging of the traction battery is the larger second SOC interval value, and/or it is determined that the discharging parameter corresponding to the discharging of the traction battery is the smaller second discharging parameter. This technical solution makes it possible to more conveniently determine the SOC interval value and the discharging parameter corresponding to the discharging of the traction battery based on the state parameter of the traction battery; when the state of charge of the traction battery is high, makes it possible to prevent the occurrence of lithium precipitation, and on the basis of improving the safety performance of the traction battery, relatively increase a charge rate of the traction battery; and when the state of charge of the traction battery is low, makes it possible to prevent the occurrence of lithium precipitation and reduce the risk of undervoltage, and fully ensure the safety performance of the traction battery.

In some possible implementations, the state parameter includes the SOH, and the discharging parameter includes the discharging time and/or the discharging current; and the determining an SOC interval value and a discharging parameter corresponding to discharging of the traction battery based on the state parameter of the traction battery includes: if the SOH of the traction battery is greater than or equal to a preset SOH threshold, determining that the SOC interval value is a third SOC interval value, and the discharging parameter is a third discharging parameter; and if the SOH of the traction battery is less than the preset SOH threshold, determining that the SOC interval value is a fourth SOC interval value, and the discharging parameter is a fourth discharging parameter, where the third SOC interval value is greater than the fourth SOC interval value, and/or the third discharging parameter is greater than the fourth discharging parameter.

In the technical solution of this implementation, one preset SOH threshold is set to divide the SOH of the traction battery into two ranges. If the SOH of the traction battery is greater than or equal to the preset SOH threshold, a state of health of the traction battery is relatively good and a discharge capacity is relatively strong. Then, it is determined that the SOC interval value corresponding to the discharging of the traction battery is the larger third SOC interval value, and/or it is determined that the discharging parameter corresponding to the discharging of the traction battery is the larger third discharging parameter. Otherwise, if the SOH of the traction battery is less than the preset SOH threshold, the state of health of the traction battery is relatively poor and the discharge capacity is relatively weak. Then, it is determined that the SOC interval value corresponding to the discharging of the traction battery is the smaller fourth SOC interval value, and/or it is determined that the discharging parameter corresponding to the discharging of the traction battery is the smaller fourth discharging parameter. This technical solution makes it possible to more conveniently determine the SOC interval value and the discharging parameter corresponding to the discharging of the traction battery based on the SOH of the traction battery; when the state of health of the traction battery is relatively good, makes it possible to fully ensure the safety performance of the traction battery and relatively increase a charge rate of the traction battery and charging performance; and when the state of health of the traction battery is relatively poor, makes it possible to prevent the occurrence of lithium precipitation and fully ensure the safety performance of the traction battery.

In some possible implementations, the state parameter includes the temperature, and the discharging parameter includes the discharging time and/or the discharging current; and the determining an SOC interval value and a discharging parameter corresponding to discharging of the traction battery based on the state parameter of the traction battery includes: if the temperature of the traction battery is greater than or equal to a first preset temperature threshold, determining that the SOC interval value is a fifth SOC interval value, and the discharging parameter is a fifth discharging parameter; if the temperature of the traction battery is less than the first preset temperature threshold and greater than or equal to a second preset temperature threshold, determining that the SOC interval value is a sixth SOC interval value, and the discharging parameter is a sixth discharging parameter; and if the temperature of the traction battery is less than the second preset temperature threshold, determine that the SOC interval value is a seventh SOC interval value, and the discharging parameter is a seventh discharging parameter, where the sixth SOC interval value is greater than the fifth SOC interval value and the seventh SOC interval value, and/or the sixth discharging parameter is greater than the fifth discharging parameter and the seventh discharging parameter.

In the technical solution of this implementation, two preset temperature thresholds are set to divide the temperature of the traction battery into three ranges, that is, an appropriate temperature range and two inappropriate temperature ranges of the traction battery. If the temperature of the traction battery is less than the first preset temperature threshold and greater than or equal to the second preset temperature threshold, that is, the temperature of the traction battery is within the appropriate temperature range, the risk of lithium precipitation in the traction battery is relatively low and the discharge capacity is relatively strong. Then, it is determined that the SOC interval value corresponding to the discharging of the traction battery is the larger sixth SOC interval value, and/or it is determined that the discharging parameter corresponding to the discharging of the traction battery is the larger sixth discharging parameter. Otherwise, if the temperature of the traction battery is greater than or equal to the first preset temperature threshold or less than the second preset temperature threshold, that is, the temperature of the traction battery is within the inappropriate temperature range, the risk of lithium precipitation in the traction battery is relatively high and the discharge capacity is relatively weak. Then, it is determined that the SOC interval value corresponding to the discharging of the traction battery is the smaller fifth SOC interval value or seventh SOC interval value, and/or it is determined that the discharging parameter corresponding to the discharging of the traction battery is the smaller fifth discharging parameter or seventh discharging parameter. This technical solution makes it possible to more conveniently determine the SOC interval value and the discharging parameter corresponding to the discharging of the traction battery based on the temperature of the traction battery; when the temperature of the traction battery is within the appropriate temperature range, makes it possible to fully ensure the safety performance of the traction battery and relatively increase a charge rate and charging performance; and when the temperature of the traction battery is within the inappropriate temperature range, makes it possible to prevent the occurrence of lithium precipitation and fully ensure the safety performance of the traction battery.

In some possible implementations, the determining an SOC interval value and a discharging parameter corresponding to discharging of the traction battery based on the state parameter of the traction battery includes: determining the SOC interval value and the discharging parameter corresponding to the discharging of the traction battery based on the state parameter of the traction battery and a preset mapping relationship.

In the technical solution of this implementation, the SOC interval value and the discharging parameter corresponding to the discharging of the traction battery may be determined based on a plurality of types of state parameters of the traction battery and the preset mapping relationship, to comprehensively improve the safety performance and the charging performance of the traction battery.

In some possible implementations, the discharging current ranges from 1 A to 5 A, and the discharging time ranges from 1 s to 60 s.

In some possible implementations, the SOC interval value ranges from 3% to 95%.

In some possible implementations, before the controlling the traction battery to discharge with the discharging parameter, the method further includes: sending charging demand information, where a current demand value carried in the charging demand information is zero, and the charging demand information is used to control the traction battery to stop being charged.

If the traction battery is directly controlled to discharge in the charging process of the traction battery, it will not only cause damage to the traction battery and affect the life of the traction battery, but also bring a potential safety hazard and affect the safety of the traction battery. In the technical solution of this implementation, after the BMS sends the charging demand information, and the charging demand information is used to control the traction battery to stop being charged, the BMS then controls the traction battery to discharge, which can ensure the life and performance of the traction battery and improve the safety of a charging and discharging process of the traction battery.

In some possible implementations, before the controlling the traction battery to discharge, the method further includes: obtaining a current of the traction battery; and the controlling the traction battery to discharge with the discharging parameter includes: when the current of the traction battery is less than or equal to a preset current threshold, controlling the traction battery to discharge with the discharging parameter.

In the technical solution of this implementation, before controlling the traction battery to discharge, the BMS first obtains the current of the traction battery. When the current of the traction battery is small, for example, it is less than or equal to the preset current threshold. The BMS controls the traction battery to discharge only when impact on the discharging of the traction battery is small, which can further ensure the life and performance of the traction battery and improve the safety of the charging and discharging process of the traction battery.

In some possible implementations, after the traction battery is controlled to perform pulse discharge, the method further includes: when the discharging time of the traction battery is greater than or equal to a first preset time threshold or a time elapsed after the charging demand information is sent is greater than or equal to a second preset time threshold, controlling the traction battery to stop discharging.

In the charging process of the traction battery, a charging apparatus for charging the traction battery, such as a charger, can regularly or irregularly receive the charging demand information sent by the BMS. When the charging demand information is sent normally, the charging apparatus and the traction battery can maintain a normal communication state, and if the charging apparatus does not receive the charging demand information sent by the BMS within a period of time, it may cause the charging apparatus to disconnect a communication connection to the traction battery. Therefore, in the technical solution of this implementation, in addition to setting the first preset time threshold to control the discharging time of the traction battery, the second time threshold is also set to compare with the time elapsed after the charging demand information is sent, to prevent the time elapsed after the charging demand information is sent being too long and affecting the normal charging process of the traction battery, thereby improving the charging efficiency of the traction battery.

In some possible implementations, the method further includes: obtaining an operating status of the traction battery; and when the traction battery is in a state of unplugging a charging gun or a fully charged state, controlling the traction battery to discharge.

In the technical solution of this implementation, the BMS further obtains the operating status of the traction battery, and when the traction battery is in the state of unplugging a charging gun or the fully charged state, the BMS may control the traction battery to temporarily discharge, for example, discharge for a discharging time that is less than the preset time threshold and/or with a discharging current that is less than the preset current threshold, to prevent directly charging of the traction battery from causing the risk of lithium precipitation in the traction battery after the charging apparatus establishes a connection to the traction battery in a subsequent charging process of the traction battery, which will further improve the safety performance of the traction battery.

According to a second aspect, a battery management system BMS of a traction battery is provided, including: an obtaining module configured to: in a charging process of the traction battery, obtain a state parameter of the traction battery, where the state parameter includes at least one of the following parameters: a state of charge SOC, a state of health SOH, and a temperature; and a control module configured to determine an SOC interval value and a discharging parameter corresponding to discharging of the traction battery based on the state parameter of the traction battery, where the discharging parameter includes at least one of the following parameters: a discharging time, a discharging current, and a discharging waveform; and each time the SOC of the traction battery changes by the SOC interval value, control the traction battery to discharge with the discharging parameter.

In some possible implementations, the state parameter includes the SOC, and the discharging parameter includes the discharging time and/or the discharging current; and the control module is configured to: if the SOC of the traction battery is less than a preset SOC threshold, determine that the SOC interval value is a first SOC interval value, and the discharging parameter is a first discharging parameter; and if the SOC of the traction battery is greater than or equal to the preset SOC threshold, determine that the SOC interval value is a second SOC interval value, and the discharging parameter is a second discharging parameter, where the first SOC interval value is greater than the second SOC interval value, and/or the first discharging parameter is less than the second discharging parameter.

In some possible implementations, the state parameter includes: the SOH, and the discharging parameter includes the discharging time and/or the discharging current; and the control module is configured to: if the SOH of the traction battery is greater than or equal to a preset SOH threshold, determine that the SOC interval value is a third SOC interval value, and the discharging parameter is a third discharging parameter; and if the SOH of the traction battery is less than the preset SOH threshold, determine that the SOC interval value is a fourth SOC interval value, and the discharging parameter is a fourth discharging parameter, where the third SOC interval value is greater than the fourth SOC interval value, and/or the third discharging parameter is greater than the fourth discharging parameter.

In some possible implementations, the state parameter includes the temperature, and the discharging parameter includes the discharging time and/or the discharging current; and the control module is configured to: if the temperature of the traction battery is greater than or equal to a first preset temperature threshold, determine that the SOC interval value is a fifth SOC interval value, and the discharging parameter is a fifth discharging parameter; if the temperature of the traction battery is less than the first preset temperature threshold and greater than or equal to a second preset temperature threshold, determine that the SOC interval value is a sixth SOC interval value, and the discharging parameter is a sixth discharging parameter; and if the temperature of the traction battery is less than the second preset temperature threshold, determine that the SOC interval value is a seventh SOC interval value, and the discharging parameter is a seventh discharging parameter, where the sixth SOC interval value is greater than the fifth SOC interval value and the seventh SOC interval value, and/or the sixth discharging parameter is greater than the fifth discharging parameter and the seventh discharging parameter.

In some possible implementations, the control module is configured to: determine the SOC interval value and the discharging parameter corresponding to the discharging of the traction battery based on the state parameter of the traction battery and a preset mapping relationship.

In some possible implementations, the discharging current ranges from 1 A to 5 A, and the discharging time ranges from 1 s to 60 s.

In some possible implementations, the SOC interval value ranges from 3% to 95%.

In some possible implementations, the BMS further includes a sending module configured to send charging demand information, where a current demand value carried in the charging demand information is zero, and the charging demand information is used to control the traction battery to stop being charged.

In some possible implementations, the obtaining module is further configured to: obtain a current of the traction battery; and the control module is configured to: when the current of the traction battery is less than or equal to a preset current threshold, control the traction battery to discharge with the discharging parameter.

In some possible implementations, the control module is further configured to: when the discharging time of the traction battery is greater than or equal to a first preset time threshold or a time elapsed after the charging demand information is sent is greater than or equal to a second preset time threshold, control the traction battery to stop discharging.

According to a third aspect, a battery management system BMS of a traction battery is provided, including a processor and a memory, where the memory is configured to store a computer program, and the processor is configured to invoke the computer program to perform the method for charging the traction battery in the first aspect or any possible implementation of the first aspect.

Through the technical solution of this embodiment of the present application, in the charging process of the traction battery, the traction battery can be controlled to discharge to prevent the risk of lithium precipitation in the traction battery and improve the safety performance of the traction battery. Further, a discharging interval and the discharging parameter in the charging process of the traction battery may be determined based on the state parameter of the traction battery, and the discharging interval is the SOC interval, where the state parameter may include: at least one of the state of charge SOC, the state of health SOH, and the temperature, these state parameters are all important parameters affecting the performance of the traction battery, and may affect the occurrence of lithium precipitation in the traction battery. Based on the state parameter of the traction battery, the traction battery is controlled to discharge with the SOC interval value and the discharging parameter in the charging process, so that a discharge design of the traction battery in the charging process is more proper, and on the basis of ensuring the safety performance of the traction battery, the charging performance of the traction battery is also improved.

BRIEF DESCRIPTION OF THE DRAWINGS

In order to illustrate the technical solutions of the embodiments of the present application more clearly, the drawings required in the description of the embodiments of the present application will be described briefly below. Obviously, the drawings described below are merely some embodiments of the present application, and for those of ordinary skill in the art, other drawings can also be obtained from these drawings without any creative efforts.

FIG. 1 is an architectural diagram of a battery system to which an embodiment of the present application is applicable;

FIG. 2 is a schematic flow block diagram of a method for charging a traction battery according to an embodiment of the present application;

FIG. 5 is a schematic flow block diagram of another method for charging a traction battery according to an embodiment of the present application;

FIG. 6 is a schematic flow block diagram of another method for charging a traction battery according to an embodiment of the present application;

FIG. 7 is a schematic flow block diagram of another method for charging a traction battery according to an embodiment of the present application;

FIG. 8 is a schematic flow block diagram of another method for charging a traction battery according to an embodiment of the present application;

FIG. 9 is a schematic flow block diagram of another method for charging a traction battery according to an embodiment of the present application;

FIG. 10 is a schematic block diagram of a structure of a battery management system according to an embodiment of the present application.

DETAILED DESCRIPTION OF EMBODIMENTS

Figure 3:
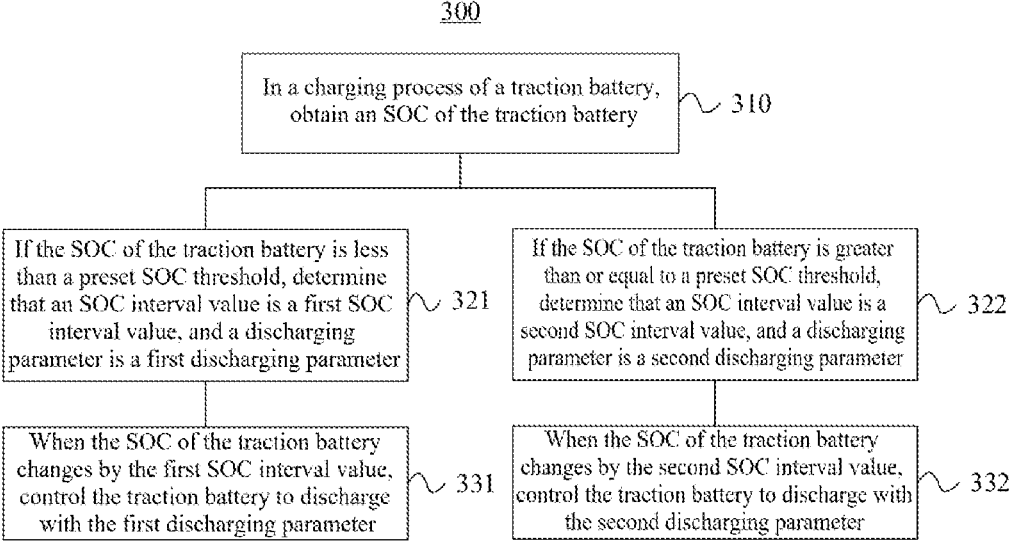
FIG. 3 is a schematic flow block diagram of another method for charging a traction battery according to an embodiment of the present application.

The implementations of the present application will be further described in detail below in conjunction with the accompanying drawings and embodiments. The following detailed description of the embodiments and the accompanying drawings are used to illustrate the principle of the present application by way of example but should not be used to limit the scope of the present application. That is, the present application is not limited to the described embodiments.

In the description of the present application, it should be noted that "a plurality of" means two or more, unless otherwise specified. The orientation or position relationship indicated by the terms "upper", "lower", "left", "right", "inner", "outer", etc. is only for the convenience of describing the present application and simplifying the description, rather than indicating or implying that the device or element referred to must have a particular orientation or be constructed and operated in a particular orientation, and therefore should not be construed as a limitation on the present application. In addition, the terms "first", "second", "third", etc. are used for descriptive purposes only, and should not be construed as indicating or implying the relative importance.

The orientation terms in the following description all indicate directions shown in the drawings, but do not limit the specific structure in the present application. In the description of the present application, it should also be noted that the terms "disposing", "connecting", and "connection"

should be interpreted in the broad sense unless explicitly defined and limited otherwise. For example, the terms may mean a fixed connection, a detachable connection, or an integral connection, or may mean a direct connection, or an indirect connection by means of an intermediate medium. For those of ordinary skill in the art, the specific meanings of the terms mentioned above in the present application can be construed according to specific circumstances.

In the new energy field, a traction battery is used as a main power source for a power consuming apparatus (such as a vehicle, a ship, or a spacecraft). The importance of the traction battery is self-evident. At present, most of the traction batteries on the market are rechargeable batteries, with most commonly lithium ion batteries or lithium ion polymer batteries. Continuous charging of the traction battery at low temperature, or continuous charging of the traction battery through a large charge rate or charging voltage, will cause lithium precipitation in the traction battery.

Lithium precipitation not only reduces the performance of the traction battery and greatly shortens a cycle life, but also limits a fast charging capacity of the traction battery, and may cause catastrophic consequences such as combustion and explosion, seriously affecting the overall performance of the traction battery.

In view of this, the present application proposes a method for charging a traction battery, which can solve a problem of lithium precipitation in the traction battery and improve the performance of the traction battery.

FIG. 1 shows a battery system 100 to which an embodiment of the present application is applicable.

As shown in FIG. 1, the battery system 100 may include: a traction battery 110 and a battery management system (BMS) 120.

Specifically, the traction battery 110 may include at least one battery module, which can provide energy and power for an electric vehicle. In terms of battery type, the traction battery 110 may be a lithium ion battery, a lithium metal battery, a lead-acid battery, a nickel-cadmium battery, a nickel-hydrogen battery, a lithium-sulfur battery, a lithium-air battery, a sodium-ion battery, or the like, which is not specifically limited in this embodiment of the present application. In terms of battery size, the battery module in the traction battery 110 in this embodiment of the present application may be a cell/battery cell, or may be a battery bank or battery pack, which is not specifically limited in this embodiment of the present application.

In addition, to intelligently manage and maintain the traction battery 110, prevent battery failure, and prolong a service life of the battery, the battery system 100 is generally equipped with a BMS 120, the BMS 120 is connected to the traction battery 110 and is used to monitor and acquire a parameter of the traction battery 110, and the BMS 120 may further control and manage the traction battery 110 based on the parameter.

As an example, the BMS 120 may be used to monitor and acquire parameters such as a voltage, a current, and a temperature of the traction battery 110. The BMS 120 may acquire a total voltage and a total current of the traction battery 110 in real time, a voltage and a current of a single battery cell in the traction battery 110, a temperature of at least one temperature measurement point in the traction battery 110, and the like. The real-time, fast, and accurate measurement of the above parameters is a basis for the normal operation of the BMS 120.

Optionally, the BMS 120 may further estimate a state of charge (SOC), a state of health (SOH), a state of power (SOP), and other parameters of the traction battery 110 based on the acquired parameters of the traction battery 110.

The SOC may be used to represent a remaining capacity of the traction battery 110, which is numerically defined as a ratio of a current remaining capacity to a total available capacity of the traction battery 110, usually expressed as a percentage. Specifically, when SOC=100%, it indicates that the traction battery 110 is fully charged; otherwise, when SOC=0%, it indicates that the traction battery 110 is fully discharged. Accurate estimation of the SOC is not only the most basic requirement for estimating an endurance mileage of an electric vehicle, but also a basic guarantee for improving the utilization efficiency and safety performance of the traction battery 110.

In addition, the SOH may be used to indicate a state of aging of the traction battery 110, or may be understood as a remaining life of the traction battery 110. It is well known that the performance of the traction battery 110 will continue to degrade after long-term operation. How to accurately estimate the SOH is an important prerequisite for estimating other parameters of the traction battery 110 (such as the SOC, the SOP, and other parameters). Generally, the SOH is usually expressed as a percentage. When SOH=100%, it indicates that the traction battery 110 is a new battery that has not been used. As a usage time increases, the SOH gradually decreases, and a remaining life of the traction battery becomes shorter. In the existing related art, various manners may be used to estimate the SOH of the traction battery 110, for example, the SOH may be estimated based on an available capacity of the traction battery 110. It can be understood that the available capacity of the traction battery 110 may decrease over time, and the SOH of the traction battery 110 may be estimated through a ratio of a current available capacity to an initial capacity (also referred to as a nominal capacity) of the traction battery 110.

The SOP may be used to indicate a state of power of the traction battery 110, usually represented by a short-term peak power. A peak power output from and input to the traction battery 110 directly affects the quick start, acceleration, and emergency braking capabilities of the vehicle, and further relates to the safety and reliability of the operation of the entire vehicle. Therefore, the BMS 120 needs to have a capability of estimating the peak power, that is, the SOP, of the traction battery 110.

It can be understood that the above only takes the SOC, SOH, and SOP as examples, and briefly describes some parameters that can be estimated by the BMS 120. In addition, the BMS 120 may be further used to determine other parameters of the traction battery 110, which is not specifically limited in the embodiments of the present application.

Further, after the BMS 120 obtains various parameters of the traction battery 110, various controls and managements of the traction battery 110 may be implemented based on the various parameters.

For example, the BMS 120 may control the charging and discharging of the traction battery 110 based on parameters such as the SOC, the voltage, and the current, to ensure normal energy supply and release of the traction battery 110.

For another example, the BMS 120 may further control components such as a cooling fan or a heating module based on parameters such as the temperature, to implement thermal management of the traction battery 110.

For another example, the BMS 120 may determine whether the traction battery 110 is in a normal operating state based on parameters such as the voltage and the SOH, to implement fault diagnosis and warning of the traction battery 110.

Optionally, as shown in FIG. 1, the battery system 100 may establish a connection to a charging apparatus 101 and a power consuming apparatus 102 to implement the charging and discharging of the traction battery 110.

Specifically, the BMS 120 in the battery system 100 may establish communication with the charging apparatus 101 through a related communication protocol, and then implement charging of the traction battery 110 through the charging apparatus 101.

Optionally, the BMS 120 may alternatively establish a communication connection to the power consuming apparatus 102, so that the BMS 120 may feed back obtained related information to the power consuming apparatus 102 and even the user, and the BMS 120 may also obtain related control information of the power consuming apparatus 102, to better control and manage the traction battery 110.

As an example, the charging apparatus 101 shown in FIG. 1 includes, but is not limited to, a charger (also referred to as a charging pile). In addition, the power consuming apparatus 102 may be various types of power consuming apparatuses, including but not limited to electric vehicles.

FIG. 2 is a schematic flow block diagram of a method 200 for charging a traction battery according to an embodiment of the present application. The method 200 for charging the traction battery may be applied to a battery management system BMS of a traction battery. Optionally, in this embodiment of the present application, the traction battery may be the traction battery 110 shown in FIG. 1 above, and the method 200 may be applied to the BMS 120 of the traction battery 110. In other words, the BMS 120 may be used as an execution body of the method 200 in the following embodiment of the present application.

As shown in FIG. 2, in this embodiment of the present application, the method 200 for charging the traction battery may include the following steps:

210: in a charging process of the traction battery, obtaining a state parameter of the traction battery, where the state parameter includes at least one of the following parameters: a state of charge SOC, a state of health SOH, and a temperature;

220: determining an SOC interval value and a discharging parameter corresponding to discharging of the traction battery based on the state parameter of the traction battery, where the discharging parameter includes at least one of the following parameters: a discharging time, a discharging current, and a discharging waveform; and

230: when the SOC of the traction battery changes by the SOC interval value, controlling the traction battery to discharge with the discharging parameter.

Through the technical solution of this embodiment of the present application, in the charging process of the traction battery, the traction battery can be controlled to discharge to prevent the risk of lithium precipitation in the traction battery and improve the safety performance of the traction battery. Further, a discharging interval and the discharging parameter in the charging process of the traction battery may be determined based on the state parameter of the traction battery, where the discharging parameter may include: a discharging current, a discharging voltage, and a discharging waveform. The discharging interval is the SOC interval. The state parameter may include: at least one of the state of charge SOC, the state of health SOH, and the temperature, these state parameters are all important parameters affecting the performance of the traction battery, and may affect the occurrence of lithium precipitation in the traction battery. Based on the state parameter of the traction battery, the traction battery is controlled to discharge with the SOC interval value and the discharging parameter in the charging process, so that a discharge design of the traction battery in the charging process is more proper, and on the basis of ensuring the safety performance of the traction battery, the charging performance of the traction battery is also improved.

Specifically, for the above various state parameters of the traction battery, as described in the embodiment shown in FIG. 1 above, the SOC may be used to indicate the remaining capacity of the traction battery. During the charging and discharging process of the traction battery, the SOC of the traction battery changes with time. Specifically, if the traction battery is charged, an SOC value usually expressed as a percentage may gradually increase; otherwise, if the traction battery is charged, the SOC value may gradually decrease.

In step 210 of this embodiment of the present application, the BMS may obtain the SOC in real time in the charging process of the traction battery. For the manner of obtaining the SOC, reference may be made to specific solutions in the related art, which will not be described in detail herein.

The SOH may be used to indicate a state of aging of the traction battery, or may be understood as a remaining life of the traction battery. The performance of the traction battery will continue to degrade after long-term operation, and therefore, a remaining life will be shorter, that is, the SOH value usually expressed as a percentage will be smaller.

Since the SOH of the traction battery changes slowly and a calculation manner thereof is relatively complex, before the charging process of the traction battery, the BMS may estimate the SOH of the traction battery, and store the SOH of the traction battery to a storage unit. In step 210 of this embodiment of the present application, in the charging process of the traction battery, the BMS may obtain the SOH of the traction battery from the storage unit. For a specific manner for the BMS to estimate the SOH of the traction battery, reference may be made to specific solutions in the related art, which will not be described in detail herein.

Regarding the temperature of the traction battery, in some implementations, the temperature of the traction battery may be obtained based on temperatures of all battery cells in the traction battery, for example, the temperature of the traction battery may be a temperature of a battery cell with the lowest temperature among a plurality of battery cells. Alternatively, in some other implementations, the temperature of the traction battery may be alternatively obtained based on temperatures of only some battery cells in the traction battery. The temperature of the traction battery may change in real time with factors such as the environment and the operating status of the traction battery.

In step 210 of this embodiment of the present application, the BMS may obtain the temperature of the traction battery from the storage unit, that is, the BMS may obtain the temperature of the traction battery and store the temperature to the storage unit before the charging process of the traction battery. Alternatively, the BMS may monitor and obtain the temperature of the traction battery in real time in the charging process of the traction battery. For a manner of obtaining the temperature of the traction battery, reference may be made to specific solutions in the related art, which will not be described in detail herein.

Further, in step 220 of this embodiment of the present application, the BMS determines the SOC interval value and the discharging parameter corresponding to the discharging of the traction battery based on the obtained state parameter of the traction battery, where the discharging parameter includes at least one of the following parameters: the discharging time, the discharging current, and the discharging waveform. Optionally, the discharging waveform includes but is not limited to any one or more of a square wave, a trapezoidal wave, a sine wave, or a triangular wave.

Optionally, the discharging parameter may further include other discharging parameters such as a discharge voltage, to further optimize and precisely control the discharging in the charging process, and this embodiment of the present application does not specifically limit types of other discharging parameters.

Therefore, in this embodiment of the present application, if the state parameter of the traction battery changes, that is, at least one of the SOC, the SOH, and the temperature of the traction battery changes, the SOC interval value and the discharging parameter corresponding to the discharging of the traction battery in the charging process may change accordingly. Discharging control takes into account the change of the state parameter, and takes into account the charging performance of the traction battery while improving the safety performance of the traction battery.

For step 230 of this embodiment of the present application, in the charging process of the traction battery, the SOC of the traction battery changes in real time, and when the SOC changes by the SOC interval value, the BMS controls the traction battery to discharge with the discharging parameter. As an example, if the SOC interval value is X %, and when it is detected that the SOC of the traction battery changes by X %, the BMS controls the traction battery to discharge with a specific discharging parameter, where X is a positive number less than 100.

In some specific implementations, after the BMS obtains a current SOC of the traction battery, it is determined whether the SOC is a target SOC value. The target SOC value is a SOC value determined based on the SOC interval value. For example, if the SOC interval value is 5%, the target SOC value may be 5%, 10%, 15%, or the like. When determining that the current SOC of the traction battery is the target SOC value, the BMS controls the traction battery to discharge with the discharging parameter. Otherwise, when determining that the current SOC of the traction battery is not the target SOC value, the BMS continues to continuously detect the SOC of the traction battery.

Further, in this embodiment of the present application, a process of the BMS controlling the traction battery to discharge with the discharging parameter may be understood as applying at least one negative pulse having a discharging waveform, a discharging current, and a discharging time to the traction battery, where a waveform of the negative pulse includes but is not limited to any one or more of a square wave, a trapezoidal wave, a sine wave, or a triangular wave.

Optionally, in this embodiment of the present application, a discharging object of the traction battery may be a power consuming apparatus where the traction battery is located, or may be a charging apparatus for charging the traction battery, or may be another external apparatus other than the power consuming apparatus and the charging apparatus. This embodiment of the present application does not specifically limit the discharging object of the traction battery.

Optionally, in the entire charging process of the traction battery, each time the SOC of the traction battery changes by the SOC interval value, the BMS may control the traction battery to discharge with the discharging parameter. In other words, in the entire charging process, the BMS may continuously control the discharging of the traction battery according to the change of the SOC of the traction battery.

Through the technical solution of this embodiment of the present application, the SOC interval value instead of another type of interval value is determined based on the state parameter of the traction battery, which can better perform discharging control based on the current state parameter of the traction battery, and further improve the safety performance and the charging performance of the battery.

FIG. 3 is a schematic flow block diagram of another method 300 for charging a traction battery according to an embodiment of the present application.

In this embodiment of the present application, a state parameter of the traction battery may include an SOC, and a discharging parameter includes a discharging time and/or a discharging current.

As shown in FIG. 3, the method 300 for charging the traction battery may include the following steps:

310: in a charging process of the traction battery, obtaining the SOC of the traction battery;

321: if the SOC of the traction battery is less than a preset SOC threshold, determining that an SOC interval value is a first SOC interval value, and the discharging parameter is a first discharging parameter; and

331: when the SOC of the traction battery changes by the first SOC interval value, controlling the traction battery to discharge with the first discharging parameter; or

322: if the SOC of the traction battery is greater than or equal to a preset SOC threshold, determining that an SOC interval value is a second SOC interval value, and the discharging parameter is a second discharging parameter; and

332: when the SOC of the traction battery changes by the second SOC interval value, controlling the traction battery to discharge with the second discharging parameter.

Specifically, in this embodiment of the present application, for the related technical solutions of step 310, reference may be made to the related description of step 210 in FIG. 2 above, which will not be described in detail herein.

In addition, step 321 and step 322 in this embodiment of the present application may be a relatively specific implementation of step 220 in FIG. 2 above. Correspondingly, step 331 and step 332 in this embodiment of the present application may be a relatively specific implementation of step 230 in FIG. 2 above.

For step 321 and step 322, in this embodiment of the present application, the SOC of the traction battery may be compared with the first preset threshold, to determine the first SOC interval value and the second SOC interval value that are different, and the first discharging parameter and the second discharging parameter that are different. The first SOC interval value is greater than the second SOC interval value, and/or the first discharging parameter is less than the second discharging parameter.

Specifically, the first discharging parameter includes a first discharging current and a first discharging time, and the second discharging parameter includes a second discharging current and a second discharging time. In this embodiment of the present application, the first discharging current is less than the second discharging current, and/or the first discharging time is less than the second discharging time.

In this embodiment of the present application, if the SOC of the traction battery is relatively large (that is, greater than or equal to the preset SOC threshold), it means that a current remaining capacity of the traction battery is relatively high, a potential of a negative electrode of the traction battery is relatively low, and the negative electrode is more prone to lithium precipitation. In this case, a discharge capacity of the traction battery is relatively strong. Correspondingly, if the SOC of the traction battery is relatively small (that is, less than or equal to the preset SOC threshold), it means that the current remaining capacity of the traction battery is relatively low, the potential of the negative electrode of the traction battery is relatively high, and the negative electrode is less prone to lithium precipitation compared with the case in which the potential of the negative electrode is relatively low. In this case, the discharge capacity of the traction battery is relatively weak.

Therefore, when the SOC of the traction battery is relatively large, that is, when the risk of lithium precipitation is relatively high, discharging frequency of the traction battery is increased, and the traction battery is controlled to discharge at an interval with a smaller SOC interval value (such as the second SOC interval value), which prevents the occurrence of lithium precipitation, and ensures the safety performance of the battery; and/or when the discharge capacity of the traction battery is relatively strong, the discharging parameter of the traction battery may be increased, and a larger discharging time and/or discharging current (such as the second discharging current and/or second discharging time) may be used to control the traction battery to discharge, to further improve the safety performance of the traction battery.

Correspondingly, when the SOC of the traction battery is relatively small and the risk of lithium precipitation is relatively low, the discharging frequency of the traction battery may be reduced, and the traction battery may be controlled to discharge at an interval with a larger SOC interval value (such as the first SOC interval value), which may also prevent the occurrence of lithium precipitation, and relatively increase the charge rate of the traction battery while ensuring the safety performance of the traction battery. and/or when the discharge capacity of the traction battery is relatively weak, the discharging parameter of the traction battery may be decreased, and a smaller discharging time and/or discharging current (such as the first discharging current and/or first discharging time) may be used to control the traction battery to discharge, which may prevent the traction battery with a low SOC from a risk of undervoltage while preventing the occurrence of lithium precipitation, thereby further improving the safety performance of the traction battery.

In conclusion, in this embodiment of the present application, one preset SOC threshold is set to divide the SOC of the traction battery into two ranges. If the SOC of the traction battery is greater than or equal to the preset SOC threshold, a state of charge of the traction battery is relatively high and a discharge capacity is relatively strong. Then, it is determined that the SOC interval value corresponding to the discharging of the traction battery is the smaller first SOC interval value, and/or it is determined that the discharging parameter corresponding to the discharging of the traction battery is the larger first discharging parameter. Otherwise, if the SOC of the traction battery is less than the preset SOC threshold, the state of charge of the traction battery is relatively low and the discharge capacity is relatively weak. Then, it is determined that the SOC interval value corresponding to the discharging of the traction battery is the larger second SOC interval value, and/or it is determined that the discharging parameter corresponding to the discharging of the traction battery is the smaller second discharging parameter. This technical solution makes it possible to more conveniently determine the SOC interval value and the discharging parameter corresponding to the discharging of the traction battery based on the state parameter of the traction battery; when the state of charge of the traction battery is high, makes it possible to prevent the occurrence of lithium precipitation, and on the basis of improving the safety performance of the traction battery, relatively increase a charge rate of the traction battery; and when the state of charge of the traction battery is low, makes it possible to prevent the occurrence of lithium precipitation and reduce the risk of undervoltage, and fully ensure the safety performance of the traction battery.

Optionally, the above preset SOC threshold may be used to evaluate the remaining capacity of the traction battery, to assess the risk of lithium precipitation. The preset SOC threshold may be set based on a type of the traction battery, an application scenario, actual needs, and the like. This embodiment of the present application does not specifically limit the preset SOC threshold.

Optionally, in addition to the preset SOC threshold, the above SOC interval value (including the first SOC interval value and the second SOC interval value) and the above discharging parameter (including the first discharging parameter and the second discharging parameter) may be alternatively preset values that are set based on a type of the traction battery, an application scenario, actual needs, and the like. This embodiment of the present application does not limit specific values of the SOC interval value and the discharging parameter.

In some possible implementations, the SOC interval value may range from 3% to 95%. In some scenarios that have strict requirements on the performance of the traction battery, for example, the traction battery operates in a low-temperature or ultra-low temperature environment, the above first SOC interval value and the above second SOC interval value may be set relatively high to prevent the occurrence of lithium precipitation in the traction battery in the low temperature or ultra-low temperature environment. Certainly, in the case of other different application scenarios and different battery types, the above first SOC interval value and the above second SOC interval value may take other specific values from 3% to 95%.

In some possible implementations, the discharging current (including the first discharging current and the second discharging current) in the discharging parameter may range from 1 A to 5 A. Specifically, the discharging current is greater than or equal to 1 A, and a discharge rate of the discharging current is less than or equal to 5 C. Similarly, for different battery types and different application scenarios, the discharging current in the embodiments of the present application may be set according to actual situations.

In some possible implementations, the discharging time (including the first discharging time and the second discharging time) in the discharging parameter may range from 1 s to 60 s, so that the traction battery can be effectively controlled to discharge without greatly affecting the overall charging time of the traction battery.

In the embodiment of the present application shown in FIG. 3 above, only one preset SOC threshold is set to divide the SOC of the traction battery into two ranges, so that two different SOC interval values and discharging parameters are set correspondingly, and similarly, two or more preset SOC thresholds may be further set to divide the SOC of the traction battery into three or more ranges, so that more different SOC interval values and discharging parameters are set correspondingly, so as to adaptively improve the accuracy of discharging control in different SOC ranges, and further accurately taking into account the safety performance and the charge rate of the traction battery.

As an example, two preset SOC thresholds may be set, which are 1 #preset SOC threshold A % and 2 #preset SOC threshold B %, where A %<B %. When the SOC of the traction battery is within a range [0, A %), the SOC interval value is 1 #SOC interval value $c_1$%, the discharging current is 1 #discharging current $i_1$, and the discharging time is 1 #discharging time $t_1$. When the SOC of the traction battery is within a range [A %, B %), the SOC interval value is 2 #SOC interval value $c_2$%, the discharging current is 2 #discharging current $i_2$, and the discharging time is 2 #discharging time $t_2$. When the SOC of the traction battery is within a range [B %, 100%], the SOC interval value is 3 #SOC interval value $c_3$%, the discharging current is 3 #discharging current $i_3$, and the discharging time is 3 #discharging time $t_3$. Herein, $c_1$%>$c_2$%>$c_3$%, and/or $i_1$<$i_2$<$i_3$ and/or $t_1$<$t_2$<$t_3$. A %, B %, $c_1$%, $c_2$%, $c_3$%, $i_1$, $i_2$, $i_3$, $t_1$, $t_2$, and $t_3$ are all positive numbers.

Optionally, the plurality of SOC interval values above (including 1 #SOC interval value, 2 #SOC interval value, and 3 #SOC interval value) may also range from 3% to 95%. The plurality of discharging currents above (including 1 #discharging current, 2 #discharging current, and 3 #discharging current) may also range from 1 A to 5 A. The plurality of discharging times above (including 1 #discharging time, 2 #discharging time, and 3 #discharging time) may also range from 1 s to 60 s.

Figure 4:
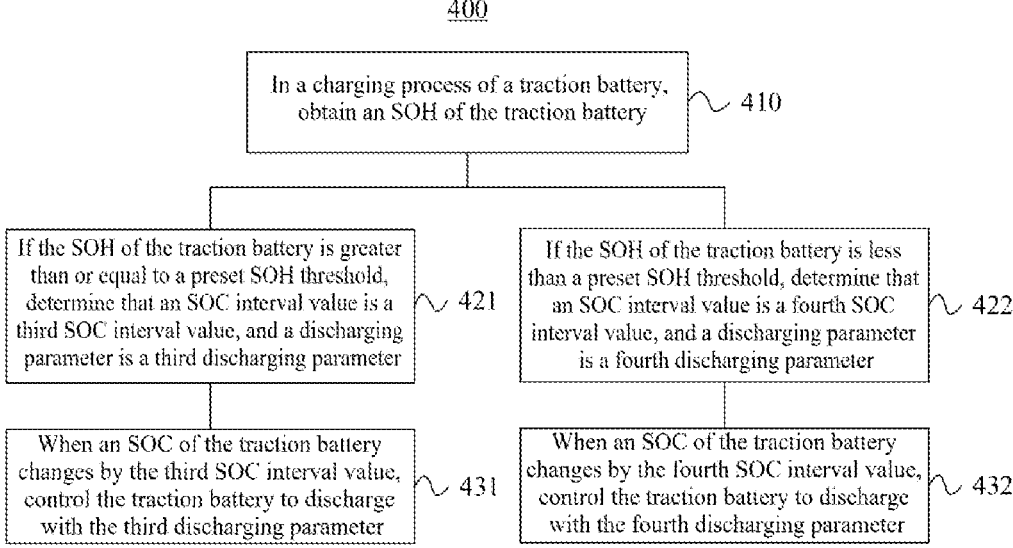
FIG. 4 is a schematic flow block diagram of another method for charging a traction battery according to an embodiment of the present application.

FIG. 4 is a schematic flow block diagram of another method 400 for charging a traction battery according to an embodiment of the present application.

In this embodiment of the present application, a state parameter of the traction battery includes an SOH, and a discharging parameter includes a discharging time and/or a discharging current.

As shown in FIG. 4, the method 400 for charging the traction battery may include the following steps:

410: in a charging process of the traction battery, obtaining the SOH of the traction battery;

421: if the SOH of the traction battery is greater than or equal to a preset SOH threshold, determining that an SOC interval value is a third SOC interval value, and the discharging parameter is a third discharging parameter; and 431: when an SOC of the traction battery changes by the third SOC interval value, controlling the traction battery to discharge with the third discharging parameter; or 422: if the SOH of the traction battery is less than a preset SOH threshold, determining that an SOC interval value is a fourth SOC interval value, and the discharging parameter is a fourth discharging parameter; and 432: when an SOC of the traction battery changes by the fourth SOC interval value, controlling the traction battery to discharge with the fourth discharging parameter.

Specifically, in this embodiment of the present application, for the related technical solutions of step 410, reference may be made to the related description of step 210 in FIG. 2 above, which will not be described in detail herein.

In addition, step 421 and step 422 in this embodiment of the present application may be a relatively specific implementation of step 220 in FIG. 2 above. Correspondingly, step 431 and step 432 in this embodiment of the present application may be a relatively specific implementation of step 230 in FIG. 2 above.

For step 421 and step 422, in this embodiment of the present application, the SOH of the traction battery may be compared with the preset SOH threshold to determine the third SOC interval value and the fourth SOC interval value that are different, and the third discharging parameter and the fourth discharging parameter that are different. The third SOC interval value is greater than the fourth SOC interval value, and/or the third discharging parameter is greater than the fourth discharging parameter.

Specifically, the third discharging parameter includes a third discharging current and a third discharging time, and the fourth discharging parameter includes a fourth discharging current and a fourth discharging time. In this embodiment of the present application, the third discharging current is greater than the fourth discharging current, and/or the third discharging time is greater than the fourth discharging time.

Specifically, when a state of health of the traction battery is relatively good and the SOH is relatively large (for example, greater than or equal to the preset SOH threshold), the risk of lithium precipitation in the traction battery is relatively low, and the discharge capacity of the traction battery is relatively strong in this case. Correspondingly, when the state of health of the traction battery is relatively poor and the SOH is relatively small (for example, less than the preset SOH threshold), the traction battery is more prone to lithium precipitation, and the discharge capacity of the traction battery is relatively weak in this case.

Therefore, when the SOH of the traction battery is relatively large and the risk of lithium precipitation is relatively low, the discharging frequency of the traction battery may be reduced, and the traction battery may be controlled to discharge at an interval with a larger SOC interval value (such as the third SOC interval value), which may also ensure that lithium precipitation does not occur in the traction battery, and the charge rate is relatively increased; and/or when the discharge capacity of the traction battery is relatively strong, the discharging parameter of the traction battery may be increased, and a larger discharging time and/or discharging current (such as the third discharging current and/or third discharging time) may be used to control the traction battery to discharge, to further prevent the occurrence of lithium precipitation, and ensure the safety performance of the battery.

Correspondingly, when the SOH of the traction battery is relatively small and the risk of lithium precipitation is relatively high, the discharging frequency of the traction battery may be increased, and the traction battery is controlled to discharge at an interval with a smaller SOC interval value (such as the fourth SOC interval value), which prevents the occurrence of lithium precipitation in the traction battery, and ensures the safety performance of the traction battery; and/or when the discharge capacity of the traction battery is relatively weak, the discharging parameter of the traction battery may be decreased, and a smaller discharging time and/or discharging current (such as the fourth discharging current and/or fourth discharging time) may be used to control the traction battery to discharge, which may prevent the risk of lithium precipitation, thereby further improving the safety performance of the traction battery.

In conclusion, in this embodiment of the present application, one preset SOH threshold is set to divide the SOH of the traction battery into two ranges. If the SOH of the traction battery is greater than or equal to the preset SOH threshold, a state of health of the traction battery is relatively good and a discharge capacity is relatively strong. Then, it is determined that the SOC interval value corresponding to the discharging of the traction battery is the larger third SOC interval value, and/or it is determined that the discharging parameter corresponding to the discharging of the traction battery is the larger third discharging parameter. Otherwise, if the SOH of the traction battery is less than the preset SOH threshold, the state of health of the traction battery is relatively poor and the discharge capacity is relatively weak. Then, it is determined that the SOC interval value corresponding to the discharging of the traction battery is the smaller fourth SOC interval value, and/or it is determined that the discharging parameter corresponding to the discharging of the traction battery is the smaller fourth discharging parameter. This technical solution makes it possible to more conveniently determine the SOC interval value and the discharging parameter corresponding to the discharging of the traction battery based on the SOH of the traction battery; when the state of health of the traction battery is relatively good, makes it possible to fully ensure the safety performance of the traction battery and relatively increase a charge rate of the traction battery and charging performance; and when the state of health of the traction battery is relatively poor, makes it possible to prevent the risk of lithium precipitation and fully ensure the safety performance of the traction battery.

Optionally, in this embodiment of the present application, the preset SOH threshold may be used to evaluate whether the state of health of the traction battery is good. The preset SOH threshold may be set based on a type of the traction battery, an application scenario, actual needs, and the like. This embodiment of the present application does not specifically limit the preset SOH threshold.

In some possible implementations, the preset SOH threshold may range from 80% to 99%, so that the state of health of the traction battery can be well determined based on the preset SOH threshold, and the safety performance and the charging performance of the traction battery can be ensured and balanced.

In addition, the SOC interval value (including the third SOC interval value and the fourth SOC interval value in the above embodiment) and the discharging parameter (including the third discharging parameter and the fourth discharging parameter) in this embodiment of the present application may be alternatively preset values that are set based on a type of the traction battery, an application scenario, actual needs, and the like. This embodiment of the present application does not specifically limit the SOC interval value.

In some possible implementations, the SOC interval value may range from 3% to 95%.

In some possible implementations, the discharging current (including the third discharging current and the fourth discharging current) in the discharging parameter may range from 1 A to 5 A. The discharging time (including the third discharging time and the fourth discharging time) in the discharging parameter may range from 1 s to 60 s.

In the embodiment of the present application shown in FIG. 4 above, only one preset SOH threshold is set to divide the SOH of the traction battery into two ranges, so that two different SOC interval values and discharging parameters are set correspondingly, and similarly, two or more preset SOH thresholds may be further set to divide the SOH of the traction battery into three or more ranges, so that more different SOC interval values and discharging parameters are set correspondingly, so as to adaptively improve the accuracy of discharging control in different SOH ranges, and further accurately taking into account the safety performance and the charge rate of the traction battery.

As an example, two preset SOH thresholds may be set, which are 1 #preset SOH threshold C % and 2 #preset SOH threshold D %, where C %<D %. When the SOH of the traction battery is within a range [0, C %), the SOC interval value is 4 #SOC interval value $c_4$%, the discharging current is 4 #discharging current $i_4$, and the discharging time is 4 #discharging time $t_4$. When the SOH of the traction battery is within a range [C %, D %), the SOC interval value is 5 #SOC interval value $c_5$%, the discharging current is 5 #discharging current $i_5$, and the discharging time is 5 #discharging time $t_5$. When the SOH of the traction battery is within a range [D %, 100%], the SOC interval value is 6 #SOC interval value $c_6$%, the discharging current is 6 #discharging current $i_6$, and the discharging time is 6 #discharging time $t_6$. Herein, $c_4$%<$c_5$%<$c_6$%, and/or $i_4$<$i_5$<$i_6$, and/or $t_4$<$t_5$<$t_6$. C %, D %, $c_4$%, $c_5$%, $c_6$%, $i_4$, $i_5$, $i_6$, $t_4$, $t_5$, and $t_6$ are all positive numbers.

Optionally, the plurality of SOC interval values above (including 4 #SOC interval value, 5 #SOC interval value, and 6 #SOC interval value) may also range from 3% to 95%. The plurality of discharging currents above (including 4 #discharging current, 5 #discharging current, and 6 #discharging current) may also range from 1 A to 5 A. The plurality of discharging times above (including 4 #discharging time, 5 #discharging time, and 6 #discharging time) may also range from 1 s to 60 s.

FIG. 5 is a schematic flow block diagram of another method 500 for charging a traction battery according to an embodiment of the present application.

In this embodiment of the present application, a state parameter of the traction battery may include a temperature, and a discharging parameter includes a discharging time and/or a discharging current.

As shown in FIG. 5, the method 500 for charging the traction battery may include the following steps:

510: in a charging process of the traction battery, obtaining the temperature of the traction battery;

521: if the temperature of the traction battery is greater than or equal to a first preset temperature threshold, determining that an SOC interval value is a fifth SOC interval value, and the discharging parameter is a fifth discharging parameter; and 531: when an SOC of the traction battery changes by the fifth SOC interval value, controlling the traction battery to discharge with the fifth discharging parameter; or 522: if the temperature of the traction battery is less than a first preset temperature threshold and greater than or equal to a second preset temperature threshold, determining that an SOC interval value is a sixth SOC interval value, and the discharging parameter is a sixth discharging parameter; and 532: when an SOC of the traction battery changes by the sixth SOC interval value, controlling the traction battery to discharge with the sixth discharging parameter; or 523: if the temperature of the traction battery is less than a second preset temperature threshold, determining that an SOC interval value is a seventh SOC interval value, and the discharging parameter is a seventh discharging parameter; and 533: when an SOC of the traction battery changes by the seventh SOC interval value, controlling the traction battery to discharge with the seventh discharging parameter.

Specifically, in this embodiment of the present application, for the related technical solutions of step 510, reference may be made to the related description of step 210 in FIG. 2 above, which will not be described in detail herein.

In addition, step 521, step 522, and step 523 in this embodiment of the present application may be a relatively specific implementation of step 220 in FIG. 2 above. Correspondingly, step 531, step 532, and step 533 in this embodiment of the present application may be a relatively specific implementation of step 230 in FIG. 2 above.

For step 521 and step 522, in this embodiment of the present application, the temperature of the traction battery may be compared with the preset temperature threshold to determine the fifth SOC interval value, the sixth SOC interval value, and the seventh SOC interval value that are different, and the fifth discharging parameter, the sixth discharging parameter, and the seventh discharging parameter that are different. The sixth SOC interval value is greater than the fifth SOC interval value and the seventh SOC interval value, and/or the sixth discharging parameter is greater than the fifth discharging parameter and the seventh discharging parameter.

Specifically, the fifth discharging parameter includes a fifth discharging current and a fifth discharging time, the sixth discharging parameter includes a sixth discharging current and a sixth discharging time, and the seventh discharging parameter includes a seventh discharging current and a seventh discharging time. In this embodiment of the present application, the fifth discharging current is greater than the sixth discharging current and the seventh discharging current, and/or the fifth discharging time is greater than the sixth discharging time and the seventh discharging time.

Specifically, the risk of lithium precipitation and the discharge capacity of the traction battery are related to the temperature of the traction battery. When the temperature of the traction battery is within an appropriate temperature range, the risk of lithium precipitation in the traction battery is relatively low, and the discharge capacity is relatively strong. However, outside the appropriate temperature range, the risk of lithium precipitation in the traction battery increases, and the discharge capacity is relatively weak.

Therefore, when the temperature of the traction battery is within the appropriate temperature range (for example, the temperature of the traction battery is less than the first preset temperature threshold and greater than or equal to the second preset temperature threshold), that is, when the risk of lithium precipitation in the traction battery is relatively low, the discharging frequency of the traction battery may be reduced, and the traction battery may be controlled to discharge at an interval with a larger SOC interval value (such as the sixth SOC interval value), which may also ensure that lithium precipitation does not occur in the traction battery, and the charge rate is relatively increased; and/or when the discharge capacity of the traction battery is relatively strong, the discharging parameter of the traction battery may be increased, and a larger discharging time and/or discharging current (such as the sixth discharging current and/or sixth discharging time) may be used to control the traction battery to discharge, to further prevent the occurrence of lithium precipitation, and ensure the safety performance of the battery.

Correspondingly, when the temperature of the traction battery is outside the appropriate temperature range (for example, the temperature of the traction battery is greater than or equal to the first preset temperature threshold or less than the second preset temperature threshold), that is, when the risk of lithium precipitation in the traction battery is relatively high, the discharging frequency of the traction battery may be increased, and the traction battery may be controlled to discharge at an interval with a smaller SOC interval value (such as the fifth SOC interval value or the seventh SOC interval value), which prevents the occurrence of lithium precipitation, and ensures the safety performance of the battery; and/or when the discharge capacity of the traction battery is relatively weak, the discharging parameter of the traction battery may be decreased, and a smaller discharging time and/or discharging current (such as the fifth discharging current and/or fifth discharging time, or the seventh discharging current and/or seventh discharging time) may be used to control the traction battery to discharge, which may prevent the risk of lithium precipitation, and fully ensure the safety performance of the traction battery.

In conclusion, in this embodiment of the present application, two preset temperature thresholds are set to divide the temperature of the traction battery into three ranges, that is, one appropriate temperature range and two inappropriate temperature ranges of the traction battery. If the temperature of the traction battery is less than the first preset temperature threshold and greater than or equal to the second preset temperature threshold, that is, the temperature of the traction battery is within the appropriate temperature range, the risk of lithium precipitation in the traction battery is relatively low and the discharge capacity is relatively strong. Then, it is determined that the SOC interval value corresponding to the discharging of the traction battery is the larger sixth SOC interval value, and/or it is determined that the discharging parameter corresponding to the discharging of the traction battery is the larger sixth discharging parameter. Otherwise, if the temperature of the traction battery is greater than or equal to the first preset temperature threshold or less than the second preset temperature threshold, that is, the temperature of the traction battery is within the inappropriate temperature range, the risk of lithium precipitation in the traction battery is relatively high and the discharge capacity is relatively weak. Then, it is determined that the SOC interval value corresponding to the discharging of the traction battery is the smaller fifth SOC interval value or seventh SOC interval value, and/or it is determined that the discharging parameter corresponding to the discharging of the traction battery is the smaller fifth discharging parameter or seventh discharging parameter. This technical solution makes it possible to more conveniently determine the SOC interval value and the discharging parameter corresponding to the discharging of the traction battery based on the temperature of the traction battery; when the temperature of the traction battery is within the appropriate temperature range, makes it possible to fully ensure the safety performance of the traction battery and relatively increase a charge rate and charging performance; and when the temperature of the traction battery is within the inappropriate temperature range, makes it possible to prevent the risk of lithium precipitation and fully ensure the safety performance of the traction battery.

Optionally, in this embodiment of the present application, the first preset temperature threshold and the second preset temperature threshold may be used to evaluate whether the traction battery is within the appropriate temperature range. The first preset temperature threshold and the second preset temperature threshold may be set based on a type of the traction battery, an application scenario, actual needs, and the like. This embodiment of the present application does not specifically limit the first preset temperature threshold and the second preset temperature threshold.

In some possible implementations, the first preset temperature threshold may range from 45° C. to 55° C., and the second preset temperature threshold may range from 15° C. to 25° C., so that a temperature condition of the traction battery can be well determined based on the first preset temperature threshold and the second preset temperature threshold, and the safety performance and the charging performance of the traction battery can be ensured and balanced.

In addition, the SOC interval value (including the fifth SOC interval value to the seventh SOC interval value in the above embodiment) and the discharging parameter (including the fifth discharging parameter to the seventh discharging parameter) in this embodiment of the present application may be alternatively preset values that are set based on a type of the traction battery, an application scenario, actual needs, and the like. This embodiment of the present application does not specifically limit the SOC interval value.

In some possible implementations, the SOC interval value may range from 3% to 95%.

In some possible implementations, the discharging current (including the fifth discharging current to the seventh discharging current) in the discharging parameter may range from 1 A to 5 A. The discharging time (including the fifth discharging time to the seventh discharging time) in the discharging parameter may range from 1 s to 60 s.

In the embodiment of the present application shown in FIG. 5 above, only two preset temperature thresholds are set to divide the temperature of the traction battery into three ranges, so that different SOC interval values and discharging parameters are set correspondingly, and similarly, three or more preset temperature thresholds may be further set to divide the temperature of the traction battery into more ranges, so that more different SOC interval values and discharging parameters are set correspondingly, so as to adaptively improve the accuracy of discharging control in different temperature ranges, and further accurately taking into account the safety performance and the charge rate of the traction battery.

It may be understood that, in the above embodiments shown in FIG. 3 to FIG. 5, the state parameter of the traction battery includes only a single type of state parameter. In other embodiments, the state parameter of the traction battery may alternatively include a plurality of types of state parameters, and the SOC interval value and the discharging parameter corresponding to the discharging of the traction battery may be determined based on the plurality of types of state parameters.

FIG. 6 is a schematic flow block diagram of another method 600 for charging a traction battery according to an embodiment of the present application.

As shown in FIG. 6, the method 600 for charging the traction battery may include the following steps:

610: in a charging process of the traction battery, obtaining a state parameter of the traction battery;

620: determining an SOC interval value and a discharging parameter corresponding to discharging of the traction battery based on the state parameter of the traction battery and a preset mapping relationship; and 630: when an SOC of the traction battery changes by the SOC interval value, controlling the traction battery to discharge with the discharging parameter.

Specifically, in this embodiment of the present application, for the related technical solutions of step 610 and step 630, reference may be made to the related description of step 210 and step 230 in FIG. 2 above, which will not be described in detail herein.

In addition, step 620 in this embodiment of the present application may be a relatively specific implementation of step 220 in FIG. 2 above.

Specifically, in step 620, the SOC interval value and the discharging parameter corresponding to the discharging of the traction battery may be determined based on the state parameter of the traction battery and the preset mapping relationship, where the preset mapping relationship includes but is not limited to a mapping table, a mapping map, a mapping formula, or the like.

Optionally, the preset mapping relationship may include: a preset mapping relationship among a state parameter range, the SOC interval value, and the discharging parameter of the traction battery, for example, a preset mapping relationship among an SOC range, the SOC interval value, and the discharging parameter of the traction battery, a preset mapping relationship among an SOH range, the SOC interval value, and the discharging parameter of the traction battery, and a preset mapping relationship among a temperature range, the SOC interval value, and the discharging parameter of the traction battery.

As an example, Table 1 below shows a preset mapping table of the SOC range, the SOC interval value, and the discharging parameter of the traction battery.

TABLE 1

| SOC range | SOC interval value | Discharging current (A) | Discharging time (s) |
|---|---|---|---|
| [0, A%) | $c_1$% | $i_1$ | $t_1$ |
| [A%, B%) | $c_2$% | $i_2$ | $t_2$ |
| [B%, 100%] | $c_3$% | $i_3$ | $t_3$ |

Optionally, in this mapping table, $c_1$%>$c_2$%>$c_3$%, and/or $i_1$<$i_2$<$i_3$, and/or $t_1$<$t_2$<$t_3$. Herein, A %<B %, A %, B %, $c_1$%, $c_2$%, $c_3$%, $i_1$, $i_2$, $i_3$, $t_1$, $t_2$, and $t_3$ are all positive numbers.

It can be learned from the mapping table that in the embodiment shown in FIG. 3 above, the SOC interval value and the discharging parameter such as the discharging current and the discharging time may be determined based on the preset mapping table in the embodiment of the present application and an SOC range where a current SOC of the traction battery is located.

It may be understood that the mapping table shown in Table 1 above is an example rather than a limitation, and a number and values of SOC ranges in the mapping table may be set according to actual needs, which is not specifically limited in this embodiment of the present application.

Similarly, in the above embodiments shown in FIG. 4 and FIG. 5, the SOC interval value and the discharging parameter such as the discharging current and the discharging time may be determined based on the preset mapping relationship and an SOH range where a current SOH of the traction battery is located, or based on the preset mapping relationship and a temperature range where a current temperature of the traction battery is located.

Certainly, in addition to the above preset mapping relationship among the single type of state parameter range, the SOC interval value, and the discharging parameter, the preset mapping relationship may further include: a preset mapping relationship among a plurality of types of state parameter ranges of the traction battery, the SOC interval value, and the discharging parameter, for example, a preset mapping relationship among an SOC range, an SOH range, the SOC interval value, and the discharging parameter of the traction battery, a preset mapping relationship among the SOC range, a temperature range, the SOC interval value, and the discharging parameter of the traction battery, a preset mapping relationship among the SOH range, the temperature range, the SOC interval value, and the discharging parameter of the traction battery, and a preset mapping relationship among the SOC range, the SOH range, the temperature range, the SOC interval value, and the discharging parameter of the traction battery.

As an example, Table 2 below shows a preset mapping table of the SOC range, the SOH range, the SOC interval value, and the discharging parameter of the traction battery.

TABLE 2

| SOH range | SOC range | SOC interval value | Discharging current (A) | Discharging time (s) |
|---|---|---|---|---|
| [0, C%) | [0, A%) | $c_{11}\%$ | $i_{11}$ | $t_{11}$ |
| | [A%, B %) | $c_{12}\%$ | $i_{12}$ | $t_{12}$ |
| | [B%, 100%] | $c_{13}\%$ | $i_{13}$ | $t_{13}$ |
| [C%, 100%) | [0, A%) | $c_{21}\%$ | $i_{21}$ | $t_{21}$ |
| | [A%, B%) | $c_{22}\%$ | $i_{22}$ | $t_{22}$ |
| | [B%, 100%] | $c_{23}\%$ | $i_{23}$ | $t_{23}$ |

Optionally, in the mapping table, under the same SOH range, for a relationship between the SOC interval value, the discharging current, and the discharging time corresponding to different SOC ranges, reference may be made to the related description in the embodiment shown in FIG. 3 above, that is, the following is satisfied: $c_{11}\% > c_{12}\% > c_{13}\%$, and $c_{21}\% > c_{22}\% > c_{23}\%$, and/or $i_{11} < i_{12} < i_{13}$, and $i_{21} < i_{22} < i_{23}$, and/or $t_{11} < t_{12} < t_{13}$, and $t_{21} < t_{22} < t_{23}$.

Optionally, in the mapping table, under the same SOC range, for a relationship between the SOC interval value, the discharging current, and the discharging time corresponding to different SOH ranges, reference may be made to the related description in the embodiment shown in FIG. 4 above, that is, the following is satisfied: $c_{21}\% > c_{11}\%$, $c_{22}\% > c_{21}\%$, and $c_{23}\% > c_{13}\%$, and/or $i_{21} > i_{11}$, $i_{22} > i_{12}$, and $i_{23} > i_{13}$, and/or $t_{21} > t_{11}$, $t_{22} > t_{12}$, and $t_{23} > t_{13}$.

A %<B %, A %, B %, C %, $c_{11}\%$, $c_{12}\%$, $c_{13}\%$, $c_{21}\%$, $c_{22}\%$, $c_{23}\%$, $i_{11}$, $i_{12}$, $i_{13}$, $i_{21}$, $i_{22}$, $i_{23}$, $t_{11}$, $t_{12}$, $t_{13}$, $t_{21}$, $t_{22}$, and $t_{23}$ are all positive numbers.

After the current SOH and SOC of the traction battery are obtained through the above mapping table, the SOC interval value and the discharging parameter corresponding to the discharging of the traction battery may be determined based on the ranges where the SOH and SOC are located.

It may be understood that the mapping table shown in Table 2 above is an example rather than a limitation, and numbers and values of SOC ranges and SOH ranges in the mapping table may be set according to actual needs, which is not specifically limited in this embodiment of the present application.

In addition, the preset mapping relationship among the SOC range, the temperature range, the SOC interval value, and the discharging parameter of the traction battery, the preset mapping relationship among the SOH range, the temperature range, the SOC interval value, and the discharging parameter of the traction battery, and the preset mapping relationship among the SOC range, the SOH range, the temperature range, the SOC interval value, and the discharging parameter of the traction battery each may be a mapping table similar to that shown in Table 2 above. For a specific numerical design in the mapping table, reference may be made to the related description in the embodiment shown in FIG. 3 to FIG. 5 above, which will not be described in detail herein.

In addition to the above mapping table, the preset mapping relationship in the embodiment of the present application may be further a mapping formula, a mapping map, a neural network model, or the like, and the embodiment of the present application does not specifically limit a specific form of the preset mapping relationship. Specifically, the preset mapping relationship may be a mapping relationship obtained by fitting a large amount of experimental data, which has high reliability and accuracy, so as to ensure the safety performance and the charging performance of the traction battery.

Through the technical solution of this embodiment of the present application, the SOC interval value and the discharging parameter corresponding to the discharging of the traction battery may be determined based on a plurality of types of state parameters of the traction battery and the preset mapping relationship, to comprehensively improve the safety performance and the charging performance of the traction battery.

FIG. 7 is a schematic flow block diagram of another method 700 for charging a traction battery according to an embodiment of the present application.

As shown in FIG. 7, in this embodiment of the present application, the method 700 for charging the traction battery may include the following steps:

710: in a charging process of the traction battery, obtaining a state parameter of the traction battery, where the state parameter includes at least one of the following parameters: a state of charge SOC, a state of health SOH, and a temperature;

720: determining an SOC interval value and a discharging parameter corresponding to discharging of the traction battery based on the state parameter of the traction battery, where the discharging parameter includes at least one of the following parameters: a discharging time, a discharging current, and a discharging waveform;

730: when the SOC of the traction battery changes by the SOC interval value, sending charging demand information, where a current demand value carried in the charging demand information is zero; and

740: controlling the traction battery to discharge with the discharging parameter.

Specifically, in this embodiment of the present application, for the related technical solutions of step 710 and step 720, reference may be made to the related description of the above embodiments, which will not be described in detail herein.

In step 730, when the SOC of the traction battery changes by the SOC interval value, a BMS first sends the charging demand information, the current demand value carried in the charging demand information is zero, and therefore, the charging demand information may be used to control the traction battery to stop being charged.

In some possible implementations, a charging apparatus, such as a charger, is used to charge the traction battery. In the charging process, when the SOC of the traction battery changes by the SOC interval value, the BMS first sends, to the charger, charging demand information with a current demand value being zero, the charger stops charging the traction battery based on the charging demand information.

Optionally, the charging demand information may be a communication packet. The communication packet includes but is not limited to a communication packet between the BMS and the charger that satisfies a related communication protocol. As an example, the charging demand information may be a battery charging demand BCL packet.

If the traction battery is directly controlled to discharge in the charging process of the traction battery, it will not only cause damage to the traction battery and affect the life of the traction battery, but also bring a potential safety hazard and affect the safety of the traction battery. Through the technical solution of this embodiment of the present application, after the BMS sends the charging demand information, and the charging demand information is used to control the traction battery to stop being charged, the BMS then controls the traction battery to discharge, which can ensure the life and performance of the traction battery and improve the safety of a charging and discharging process of the traction battery.

After the BMS sends the above charging demand information, the current of the traction battery changes slowly, and it takes a certain period of time to gradually drop to zero. Therefore, to further improve the safety of the charging and discharging process of the traction battery, before step 730 above, the method 700 in this embodiment of the present application may further include: obtaining the current of the traction battery. On this basis, step 740 may include: when the current of the traction battery is less than or equal to a preset current threshold, controlling the traction battery to discharge with the discharging parameter.

Through the technical solution of this embodiment of the present application, before controlling the traction battery to discharge, the BMS first obtains the current of the traction battery. When the current of the traction battery is small, for example, it is less than or equal to the preset current threshold. The BMS controls the traction battery to discharge only when impact on the discharging of the traction battery is small, which can further ensure the life and performance of the traction battery and improve the safety of the charging and discharging process of the traction battery.

Optionally, the preset current threshold may be set according to actual needs, which is not specifically limited in this embodiment of the present application. As an example, the preset current threshold may be less than or equal to 50 A.

FIG. 8 is a schematic flow block diagram of another method 800 for charging a traction battery according to an embodiment of the present application.

As shown in FIG. 8, in this embodiment of the present application, the method 800 for charging the traction battery may include the following steps:

810: in a charging process of the traction battery, obtaining a state parameter of the traction battery, where the state parameter includes at least one of the following parameters: a state of charge SOC, a state of health SOH, and a temperature;

820: determining an SOC interval value and a discharging parameter corresponding to discharging of the traction battery based on the state parameter of the traction battery, where the discharging parameter includes at least one of the following parameters: a discharging time, a discharging current, and a discharging waveform;

830: when the SOC of the traction battery changes by the SOC interval value, sending charging demand information, where a current demand value carried in the charging demand information is zero;

840: controlling the traction battery to discharge with the discharging parameter;

850: when the discharging time of the traction battery is greater than or equal to a first preset time threshold or a time elapsed after the charging demand information is sent is greater than or equal to a second preset time threshold, controlling the traction battery to stop discharging; and

860: controlling the traction battery to be charged.

Specifically, in this embodiment of the present application, for the related technical solutions of step 810 to step 840, reference may be made to the related description of the above embodiments, which will not be described in detail herein.

In addition, after the BMS controls the traction battery to discharge, it is determined whether to stop discharging based on the discharging time of the traction battery and the time elapsed after the charging demand information is sent. Specifically, when the discharging time of the traction battery is greater than or equal to the first preset time threshold, the traction battery is controlled to stop discharging; or when the time elapsed after the charging demand information is sent is greater than or equal to the second preset time threshold, the traction battery is controlled to stop discharging. Optionally, when controlling the traction battery to discharge, the BMS counts the discharging time of the traction battery, and determines whether the discharging time of the traction battery is greater than or equal to the first preset time threshold. In addition, after the charging demand information carrying a current demand value being zero is sent, the BMS may further count the time elapsed after the charging demand information is sent, and determine whether the time elapsed after the charging demand information is sent is greater than or equal to the second preset time threshold.

The first preset time threshold may be the discharging time corresponding to the discharging of the traction battery that is determined based on the state parameter of the traction battery in step 820.

In the charging process of the traction battery, a charging apparatus for charging the traction battery, such as a charger, can regularly or irregularly receive the charging demand information sent by the BMS. When the charging demand information is sent normally, the charging apparatus and the traction battery can maintain a normal communication state, and if the charging apparatus does not receive the charging demand information sent by the BMS within a period of time, it may cause the charging apparatus to disconnect a communication connection to the traction battery. Therefore, in this embodiment of the present application, in addition to setting the first preset time threshold to control the discharging time of the traction battery, the second time threshold is also set to compare with the time elapsed after the charging demand information is sent, to prevent the time elapsed after the charging demand information is sent being too long and affecting the normal charging process of the traction battery, thereby improving the charging efficiency of the traction battery.

Optionally, as shown in FIG. 8, the method 800 in this embodiment of the present application further includes step 860: controlling the traction battery to be charged. That is, after controlling the traction battery to stop discharging, the BMS controls the traction battery to be charged again.

In some implementations, the BMS may send a new charging demand message to the charging apparatus, such as a charger, and a current demand value carried in the charging demand message is not zero, but may be a current demand value determined according to a parameter of the traction battery, so that the charging apparatus may charge the traction battery based on the current demand value.

After step 860, step 810 to step 850 above may be performed again to implement a process of the BMS controlling the continuous charging and discharging of the traction battery.

FIG. 9 is a schematic flow block diagram of another method 900 for charging a traction battery according to an embodiment of the present application.

As shown in FIG. 9, in this embodiment of the present application, the method 900 for charging the traction battery may include the following steps:

910: obtaining an operating status of the traction battery;

920: in a charging process of the traction battery, obtaining a state parameter of the traction battery, where the state parameter includes at least one of the following parameters: a state of charge SOC, a state of health SOH, and a temperature;

930: determining an SOC interval value and a discharging parameter corresponding to discharging of the traction battery based on the state parameter of the traction battery, where the discharging parameter includes at least one of the following parameters: a discharging time, a discharging current, and a discharging waveform; and

940: when the SOC of the traction battery changes by the SOC interval value, controlling the traction battery to discharge with the discharging parameter; or

950: when the traction battery is in a state of unplugging a charging gun or a fully charged state, controlling the traction battery to discharge.

Specifically, in this embodiment of the present application, for the related technical solutions of step 920 to step 940, reference may be made to the related description of the above embodiments, which will not be described in detail herein.

In addition, before step 920, the BMS may first obtain the operating status of the traction battery, and when the traction battery is in a charging state, perform step 920, that is, obtain the SOC of the traction battery in the charging process of the traction battery, and perform step 930 to step 940.

For step 950, when the traction battery is in the state of unplugging a charging gun or the fully charged state, the traction battery is controlled to discharge. Specifically, the BMS may determine a current operating status of the traction battery by obtaining an operating parameter of the traction battery. When the traction battery is disconnected from the charging gun of the charger, the BMS determines that the traction battery may be in the state of unplugging a charging gun, that is, the charger is not charging the traction battery. In addition, the BMS may obtain a parameter such as a voltage of the traction battery to determine that when the SOC of the traction battery reaches 100%, the SOC of the traction battery reaches the fully charged state.

When the traction battery is in the state of unplugging a charging gun or the fully charged state, the BMS may control the traction battery to temporarily discharge, for example, discharge for a discharging time that is less than the preset time threshold and/or with a discharging current that is less than the preset current threshold, to prevent directly charging of the traction battery from causing the risk of lithium precipitation in the traction battery after the charging apparatus establishes a connection to the traction battery in a subsequent charging process of the traction battery, which will further improve the safety performance of the traction battery.

The specific embodiments of the battery charging method provided in the present application are described above with reference to FIG. 2 to FIG. 9. The specific embodiments of the related apparatus provided in the present application are described with reference to FIG. 10 and FIG. 11. It may be understood that for the related description in the various apparatus embodiments, reference may be made to the above method embodiments, and for the sake of brevity, details are not repeated herein.

FIG. 10 is a schematic block diagram of a structure of a battery management system BMS 1000 according to an embodiment of the present application. As shown in FIG. 10, the BMS 1000 includes: an obtaining module 1010 and a control module 1020.

Specifically, the obtaining module 1010 is configured to: in a charging process of the traction battery, obtain a state parameter of the traction battery, where the state parameter includes at least one of the following parameters: a state of charge SOC, a state of health SOH, and a temperature; and the control module 1020 is configured to determine an SOC interval value and a discharging parameter corresponding to discharging of the traction battery based on the state parameter of the traction battery, where the discharging parameter includes at least one of the following parameters: a discharging time, a discharging current, and a discharging waveform; and each time the SOC of the traction battery changes by the SOC interval value, control the traction battery to discharge with the discharging parameter.

In some possible implementations, the state parameter includes the SOC, and the discharging parameter includes the discharging time and/or the discharging current; and the control module 1020 is configured to: if the SOC of the traction battery is less than a preset SOC threshold, determine that the SOC interval value is a first SOC interval value, and the discharging parameter is a first discharging parameter; and if the SOC of the traction battery is greater than or equal to the preset SOC threshold, determine that the SOC interval value is a second SOC interval value, and the discharging parameter is a second discharging parameter, where the first SOC interval value is greater than the second SOC interval value, and/or the first discharging parameter is less than the second discharging parameter.

In some possible implementations, the state parameter includes: the SOH, and the discharging parameter includes the discharging time and/or the discharging current; and the control module 1020 is configured to: if the SOH of the traction battery is greater than or equal to a preset SOH threshold, determine that the SOC interval value is a third SOC interval value, and the discharging parameter is a third discharging parameter; and if the SOH of the traction battery is less than the preset SOH threshold, determine that the SOC interval value is a fourth SOC interval value, and the discharging parameter is a fourth discharging parameter, where the third SOC interval value is greater than the fourth SOC interval value, and/or the third discharging parameter is greater than the fourth discharging parameter.

In some possible implementations, the state parameter includes the temperature, and the discharging parameter includes the discharging time and/or the discharging current; and the control module 1020 is configured to: if the temperature of the traction battery is greater than or equal to a first preset temperature threshold, determine that the SOC interval value is a fifth SOC interval value, and the discharging parameter is a fifth discharging parameter; if the temperature of the traction battery is less than the first preset temperature threshold and greater than or equal to a second preset temperature threshold, determine that the SOC interval value is a sixth SOC interval value, and the discharging parameter is a sixth discharging parameter; and if the temperature of the traction battery is less than the second preset temperature threshold, determine that the SOC interval value is a seventh SOC interval value, and the discharging parameter is a seventh discharging parameter, where the sixth SOC interval value is greater than the fifth SOC interval value and the seventh SOC interval value, and/or the sixth discharging parameter is greater than the fifth discharging parameter and the seventh discharging parameter.

In some possible implementations, the control module 1020 is configured to: determine the SOC interval value and the discharging parameter corresponding to the discharging of the traction battery based on the state parameter of the traction battery and a preset mapping relationship.

In some possible implementations, the discharging current ranges from 1 A to 5 A, and the discharging time ranges from 1 s to 60 s.

In some possible implementations, the SOC interval value ranges from 3% to 95%.

In some possible implementations, as shown in FIG. 10, the BMS 1000 may further include a sending module 1030. The sending module 1030 is configured to send charging demand information, where a current demand value carried in the charging demand information is zero, and the charging demand information is used to control the traction battery to stop being charged.

In some possible implementations, the obtaining module 1010 is further configured to: obtain a current of the traction battery; and the control module 1020 is configured to: when the current of the traction battery is less than or equal to a preset current threshold, control the traction battery to discharge with the discharging parameter.

In some possible implementations, the control module 1020 is further configured to: when the discharging time of the traction battery is greater than or equal to a first preset time threshold or a time elapsed after the charging demand information is sent is greater than or equal to a second preset time threshold, control the traction battery to stop discharging.

Figure 11:
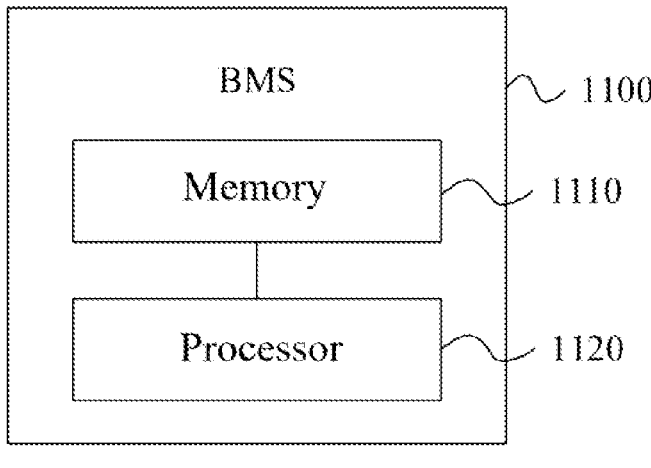
FIG. 11 is a schematic block diagram of a structure of a battery management system according to an embodiment of the present application.

FIG. 11 is a schematic block diagram of a structure of a BMS 1100 according to another embodiment of the present application. As shown in FIG. 11, the BMS 1100 includes a memory 1110 and a processor 1120, where the memory 1110 is configured to store a computer program, and the processor 1120 is configured to read the computer program and perform the methods of the above embodiments of the present application based on the computer program.

In addition, an embodiment of the present application further provides a readable storage medium configured to store a computer program, where the computer program is used to perform the methods of the above embodiments of the present application. Optionally, the computer program may be a computer program in the above BMS.

It should be understood that specific examples herein are only intended to help those skilled in the art better understand the embodiments of the present application, rather than limit the scope of the embodiments of the present application.

It should also be understood that in various embodiments of the present application, the sequence numbers of the processes do not mean the order of execution, and the execution order of the processes should be determined by their functions and internal logic, and should not be construed to limit the implementation processes of the embodiments of the present application in any way.

It should also be understood that the various implementations described in this specification may be implemented alone or in combination, which is not limited in the embodiments of the present application.

Although the present application has been described with reference to the preferred embodiments, various improvements may be made to the present application without departing from the scope of the present application and parts thereof may be replaced with equivalents. In particular, the technical features mentioned in the embodiments can be combined in any manner, provided that there is no structural conflict. The present application is not limited to the specific embodiments disclosed herein but includes all the technical solutions that fall within the scope of the claims.

The invention claimed is:

1. A method for charging a traction battery, applied to a battery management system BMS of the traction battery, wherein the method comprises:

in a charging process of the traction battery, obtaining a state parameter of the traction battery, wherein the state parameter comprises at least one of the following parameters: a state of charge SOC, a state of health SOH, and a temperature;

determining an SOC interval value and a discharging parameter corresponding to discharging of the traction battery based on the state parameter of the traction battery, wherein the discharging parameter comprises at least one of the following parameters: a discharging time, a discharging current, and a discharging waveform; and, when the SOC of the traction battery changes by the SOC interval value, controlling the traction battery to discharge with the discharging parameter, wherein the SOC interval value and the discharging parameter corresponding to discharging of the traction battery are determined based on the state parameter of the traction battery and a preset mapping relationship between the state parameter and the discharging parameter, wherein the preset mapping relationship comprises a mapping table between an SOC range, the SOC interval value corresponding to the SOC range, and the discharging parameter corresponding to the SOC range, in the mapping table, the discharging current increases as the SOC interval value decreases, and the discharging time corresponding to the discharging current increases as the SOC interval value decreases.

2. The method according to claim 1, wherein the state parameter comprises the SOH, and the discharging parameter comprises the discharging time and/or the discharging current; and, wherein determining the SOC interval value and the discharging parameter corresponding to discharging of the traction battery based on the state parameter of the traction battery comprises:

when the SOH of the traction battery is greater than or equal to a preset SOH threshold, determining that the SOC interval value is a first SOC interval value, and the discharging parameter is a first discharging parameter; and when the SOH of the traction battery is less than the preset SOH threshold, determining that the SOC interval value is a second SOC interval value, and the discharging parameter is a second discharging parameter, wherein the first SOC interval value is greater than the second SOC interval value, and/or the first discharging parameter is greater than the second discharging parameter.

3. The method according to claim 1, wherein the state parameter comprises the temperature, and the discharging parameter comprises the discharging time and/or the discharging current; and, wherein determining the SOC interval value and the discharging parameter corresponding to discharging of the traction battery based on the state parameter of the traction battery comprises:

when the temperature of the traction battery is greater than or equal to a first preset temperature threshold, determining that the SOC interval value is a first SOC interval value, and the discharging parameter is a first discharging parameter;

when the temperature of the traction battery is less than the first preset temperature threshold and greater than or equal to a second preset temperature threshold, determining that the SOC interval value is a second SOC interval value, and the discharging parameter is a second discharging parameter; and when the temperature of the traction battery is less than the second preset temperature threshold, determining that the SOC interval value is a third SOC interval value, and the discharging parameter is a third discharging parameter, wherein the second SOC interval value is greater than the first SOC interval value and the third SOC interval value, and/or the second discharging parameter is greater than the first discharging parameter and the third discharging parameter.

4. The method according to claim 1, wherein the discharging current ranges from 1 A to 5 A, and the discharging time ranges from 1 s to 60 s.

5. The method according to claim 1, wherein the SOC interval value ranges from 3% to 95%.

6. A battery management system BMS of a traction battery, comprising a processor and a memory, wherein the memory is configured to store a computer program, and the processor is configured to invoke the computer program to perform the method for charging the traction battery according to claim 1.

7. The method according to claim 1, wherein the state parameter comprises the SOC, and the discharging parameter comprises the discharging time and/or the discharging current; and, wherein determining the SOC interval value and the discharging parameter corresponding to discharging of the traction battery based on the state parameter of the traction battery comprises:

when the SOC of the traction battery is less than a preset SOC threshold, determining that the SOC interval value is a first SOC interval value, and the discharging parameter is a first discharging parameter; and when the SOC of the traction battery is greater than or equal to the preset SOC threshold, determining that the SOC interval value is a second SOC interval value, and the discharging parameter is a second discharging parameter, wherein the first SOC interval value is greater than the second SOC interval value, and/or the first discharging parameter is less than the second discharging parameter.

8. The method according to claim 1, wherein before the controlling the traction battery to discharge with the discharging parameter, the method further comprises:

sending charging demand information, wherein a current demand value carried in the charging demand information is zero, and the charging demand information is used to control the traction battery to stop being charged.

9. The method according to claim 8, wherein before the controlling the traction battery to discharge, the method further comprises:

obtaining a current of the traction battery; and the controlling the traction battery to discharge with the discharging parameter comprises:

when the current of the traction battery is less than or equal to a preset current threshold, controlling the traction battery to discharge with the discharging parameter.

10. The method according to claim 8, wherein after the traction battery is controlled to perform pulse discharge, the method further comprises:

when the discharging time of the traction battery is greater than or equal to a first preset time threshold or a time elapsed after the charging demand information is sent is greater than or equal to a second preset time threshold, controlling the traction battery to stop discharging.

11. A battery management system BMS of a traction battery, comprising:

a processor; and a memory storing a computer program executable by the processor, wherein the computer program comprises:

an obtaining module configured to: in a charging process of the traction battery, obtain a state parameter of the traction battery, wherein the state parameter comprises at least one of the following parameters: a state of charge SOC, a state of health SOH, and a temperature;

a control module configured to determine an SOC interval value and a discharging parameter corresponding to discharging of the traction battery based on the state parameter of the traction battery, wherein the discharging parameter comprises at least one of the following parameters: a discharging time, a discharging current, and a discharging waveform;

wherein, each time the SOC of the traction battery changes by the SOC interval value, the control module is configured to control the traction battery to discharge with the discharging parameter, wherein the SOC interval value and the discharging parameter corresponding to discharging of the traction battery are determined based on the state parameter of the traction battery and a preset mapping relationship between the state parameter and the discharging parameter, wherein the preset mapping relationship comprises a mapping table between an SOC range, the SOC interval value corresponding to the SOC range, and the discharging parameter corresponding to the SOC range, in the mapping table, the discharging current increases as the SOC interval value decreases, and the discharging time corresponding to the discharging current increases as the SOC interval value decreases.

12. The BMS according to claim 11, wherein the state parameter comprises: the SOH, and the discharging parameter comprises the discharging time and/or the discharging current; and the control module is configured to:

when the SOH of the traction battery is greater than or equal to a preset SOH threshold, determine that the SOC interval value is a first SOC interval value, and the discharging parameter is a first discharging parameter; and when the SOH of the traction battery is less than the preset SOH threshold, determine that the SOC interval value is a second SOC interval value, and the discharging parameter is a second discharging parameter, wherein the first SOC interval value is greater than the second SOC interval value, and/or the first discharging parameter is greater than the second discharging parameter.

13. The BMS according to claim 11, wherein the state parameter comprises the temperature, and the discharging parameter comprises the discharging time and/or the discharging current; and the control module is configured to:

when the temperature of the traction battery is greater than or equal to a first preset temperature threshold, determine that the SOC interval value is a first SOC interval value, and the discharging parameter is a first discharging parameter;

when the temperature of the traction battery is less than the first preset temperature threshold and greater than or equal to a second preset temperature threshold, determine that the SOC interval value is a second SOC interval value, and the discharging parameter is a second discharging parameter; and when the temperature of the traction battery is less than the second preset temperature threshold, determine that the SOC interval value is a third SOC interval value, and the discharging parameter is a third discharging parameter, wherein the second SOC interval value is greater than the first SOC interval value and the third SOC interval value, and/or the second discharging parameter is greater than the first discharging parameter and the third discharging parameter.

14. The BMS according to claim 11, wherein the discharging current ranges from 1 A to 5 A, and the discharging time ranges from 1 s to 60 s.

15. The BMS according to claim 11, wherein the state parameter comprises the SOC, and the discharging parameter comprises the discharging time and/or the discharging current; and the control module is further configured to:

when the SOC of the traction battery is less than a preset SOC threshold, determine that the SOC interval value is a first SOC interval value, and the discharging parameter is a first discharging parameter; and when the SOC of the traction battery is greater than or equal to the preset SOC threshold, determine that the SOC interval value is a second SOC interval value, and the discharging parameter is a second discharging parameter, wherein the first SOC interval value is greater than the second SOC interval value, and/or the first discharging parameter is less than the second discharging parameter.

16. The BMS according to claim 11, wherein the BMS further comprises a sending module configured to send charging demand information, wherein a current demand value carried in the charging demand information is zero, and the charging demand information is used to control the traction battery to stop being charged.

17. The BMS according to claim 16, wherein the obtaining module is further configured to: obtain a current of the traction battery; and the control module is configured to: when the current of the traction battery is less than or equal to a preset current threshold, control the traction battery to discharge with the discharging parameter.

18. The BMS according to claim 16, wherein the control module is further configured to: when the discharging time of the traction battery is greater than or equal to a first preset time threshold or a time elapsed after the charging demand information is sent is greater than or equal to a second preset time threshold, control the traction battery to stop discharging.

19. A method for charging a traction battery, applied to a battery management system BMS of the traction battery, wherein the method comprises:

in a charging process of the traction battery, obtaining a state parameter of the traction battery, wherein the state parameter comprises at least one of the following parameters: a state of charge SOC, a state of health SOH, and a temperature;

determining an SOC interval value and a discharging parameter corresponding to discharging of the traction battery based on the state parameter of the traction battery, wherein the discharging parameter comprises at least one of the following parameters: a discharging time, a discharging current, and a discharging waveform; and wherein when the SOC of the traction battery changes by the SOC interval value, controlling the traction battery to discharge with the discharging parameter, wherein the SOC interval value and the discharging parameter corresponding to discharging of the traction battery are determined based on the state parameter of the traction battery and a preset mapping relationship between the state parameter and the discharging parameter, wherein the preset mapping relationship comprises a mapping table between an SOH range, an SOC range, the SOC interval value corresponding to the SOC range, and the discharging parameter corresponding to the SOC range, the SOC range is corresponding to the SOH range, the SOC interval value is corresponding to the SOC range, and the discharging parameter is corresponding to the SOC range, in the mapping table, as the SOC interval value decreases within the SOH range, the discharging current increases, and the discharging time corresponding to the discharging current increases.

20. A battery management system BMS of a traction battery, comprising:

a processor; and a memory storing a computer program executable by the processor, wherein the computer program comprises:

an obtaining module configured to: in a charging process of the traction battery, obtain a state parameter of the traction battery, wherein the state parameter comprises at least one of the following parameters: a state of charge SOC, a state of health SOH, and a temperature;

a control module configured to determine an SOC interval value and a discharging parameter corresponding to discharging of the traction battery based on the state parameter of the traction battery, wherein the discharging parameter comprises at least one of the following parameters: a discharging time, a discharging current, and a discharging waveform;

wherein, each time the SOC of the traction battery changes by the SOC interval value, the control module is configured to control the traction battery to discharge with the discharging parameter, wherein the SOC interval value and the discharging parameter corresponding to discharging of the traction battery are determined based on the state parameter of the traction battery and a preset mapping relationship between the state parameter and the discharging parameter, wherein the preset mapping relationship comprises a mapping table between an SOH range, an SOC range, the SOC interval value corresponding to the SOC range, and the discharging parameter corresponding to the SOC range, the SOC range is corresponding to the SOH range, the SOC interval value is corresponding to the SOC range, and the discharging parameter is corresponding to the SOC range, in the mapping table, as the SOC interval value decreases within the SOH range, the discharging current increases, and the discharging time corresponding to the discharging current increases.

\* \* \* \* \*